United States Patent
Maeda

(10) Patent No.: US 10,460,812 B2
(45) Date of Patent: Oct. 29, 2019

(54) NONVOLATILE SEMICONDUCTOR MEMORY DEVICE

(71) Applicant: Toshiba Memory Corporation, Minato-ku (JP)

(72) Inventor: Takashi Maeda, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/260,247

(22) Filed: Jan. 29, 2019

(65) Prior Publication Data
US 2019/0156898 A1 May 23, 2019

Related U.S. Application Data

(63) Continuation of application No. 16/122,945, filed on Sep. 6, 2018, now Pat. No. 10,229,741, which is a
(Continued)

(30) Foreign Application Priority Data

Nov. 29, 2010 (JP) ................................. 2010-264872

(51) Int. Cl.
*G11C 16/04* (2006.01)
*G11C 16/16* (2006.01)
(Continued)

(52) U.S. Cl.
CPC .......... *G11C 16/16* (2013.01); *G11C 16/0483* (2013.01); *G11C 16/08* (2013.01);
(Continued)

(58) Field of Classification Search
CPC ..... G11C 16/0483; G11C 16/14; G11C 16/10; G11C 16/01
See application file for complete search history.

(56) References Cited

U.S. PATENT DOCUMENTS 5,388,065 A * 2/1995 Yoneda ................ G11C 15/046
365/154
5,761,125 A 6/1998 Himeno
(Continued)

FOREIGN PATENT DOCUMENTS

JP 2006-191017 7/2006
JP 2008-98519 4/2008
(Continued)

OTHER PUBLICATIONS

H. Tanaka et al., "Bit Cost Scalable Technology with Punch and Plug Process for Ultra High Density Flash Memory", Symposium on VLSI Technology Digest of Technical Papers, 2007, 2 Pages.
(Continued)

*Primary Examiner* — Tuan T Nguyen
(74) *Attorney, Agent, or Firm* — Oblon, McClelland, Maier & Neustadt, L.L.P.

(57) ABSTRACT

When selectively erasing one sub-block, a control circuit applies, in a first sub-block, a first voltage to bit lines and a source line, and applies a second voltage smaller than the first voltage to the word lines. Then, the control circuit applies a third voltage lower than the first voltage by a certain value to a drain-side select gate line and a source-side select gate line, thereby performing the erase operation in the first sub-block. The control circuit applies, in a second sub-block existing in an identical memory block to the selected sub-block, a fourth voltage substantially identical to the first voltage to the drain side select gate line and the source side select gate line, thereby not performing the erase operation in the second sub-block.

4 Claims, 40 Drawing Sheets

Related U.S. Application Data continuation of application No. 15/915,701, filed on Mar. 8, 2018, now Pat. No. 10,090,054, which is a continuation of application No. 15/810,489, filed on Nov. 13, 2017, now Pat. No. 9,953,713, which is a continuation of application No. 15/648,530, filed on Jul. 13, 2017, now Pat. No. 9,852,797, which is a continuation of application No. 15/403,339, filed on Jan. 11, 2017, now Pat. No. 9,747,988, which is a continuation of application No. 15/275,614, filed on Sep. 26, 2016, now Pat. No. 9,595,337, which is a continuation of application No. 14/842,382, filed on Sep. 1, 2015, now Pat. No. 9,484,105, which is a continuation of application No. 14/493,413, filed on Sep. 23, 2014, now Pat. No. 9,159,431, which is a continuation of application No. 14/098,237, filed on Dec. 5, 2013, now Pat. No. 8,861,275, which is a continuation of application No. 13/970,689, filed on Aug. 20, 2013, now Pat. No. 8,649,227, which is a continuation of application No. 13/149,139, filed on May 31, 2011, now Pat. No. 8,537,615.

(51) Int. Cl.
| | |
|---|---|
| *G11C 16/08* | (2006.01) |
| *H01L 27/1157* | (2017.01) |
| *H01L 27/11582* | (2017.01) |
| *G11C 16/14* | (2006.01) |
| *G11C 16/26* | (2006.01) |
| *G11C 16/10* | (2006.01) |
| *G11C 5/14* | (2006.01) |
| *G11C 16/30* | (2006.01) |

(52) U.S. Cl.
CPC ............ *G11C 16/10* (2013.01); *G11C 16/14* (2013.01); *G11C 16/26* (2013.01); *H01L 27/1157* (2013.01); *H01L 27/11582* (2013.01); *G11C 5/145* (2013.01); *G11C 16/30* (2013.01)

(56) References Cited

U.S. PATENT DOCUMENTS

| | | | |
|---|---|---|---|
| 6,147,911 A | 11/2000 | Takeuchi | |
| 6,785,166 B2 | 8/2004 | Iwahashi | |
| 6,967,874 B2 | 11/2005 | Hosono | |
| 7,177,196 B2 | 2/2007 | Takeuchi et al. | |
| 7,295,478 B2 | 11/2007 | Wan et al. | |
| 7,403,428 B2 | 7/2008 | Higashitani | |
| 7,466,590 B2 | 12/2008 | Hemink | |
| 7,539,056 B2 | 5/2009 | Katsumata et al. | |
| 7,558,118 B2 | 7/2009 | Futatsuyama | |
| 7,606,100 B2 | 10/2009 | Hemink et al. | |
| 7,630,251 B2 | 12/2009 | Hosono | |
| 7,630,261 B2 | 12/2009 | Abe et al. | |
| 7,649,776 B2 | 1/2010 | Abiko et al. | |
| 7,768,826 B2 | 8/2010 | Ito | |
| 8,189,391 B2 | 5/2012 | Itagaki et al. | |
| 8,203,882 B2 | 6/2012 | Hishida et al. | |
| 8,537,615 B2* | 9/2013 | Maeda ............... | G11C 16/0483 365/185.11 |
| 8,565,019 B2 | 10/2013 | Honda | |
| 8,605,508 B2 | 12/2013 | Itagaki | |
| 8,817,538 B2 | 8/2014 | Itagaki et al. | |
| 8,971,130 B2 | 3/2015 | Shibata | |
| 8,995,185 B2 | 3/2015 | Hosono | |
| 9,437,307 B2 | 9/2016 | Itagaki | |
| 9,711,229 B1 | 7/2017 | Rabkin | |
| 9,818,487 B2 | 11/2017 | Tokiwa | |
| 2006/0050559 A1 | 3/2006 | Sakui et al. | |
| 2006/0050575 A1 | 3/2006 | Mastrangelo et al. | |
| 2006/0279991 A1 | 12/2006 | Park et al. | |
| 2007/0109848 A1 | 5/2007 | Sugimae | |
| 2007/0252201 A1 | 11/2007 | Kito et al. | |
| 2007/0268750 A1 | 11/2007 | Suzuki et al. | |
| 2007/0297232 A1 | 12/2007 | Iwata | |
| 2008/0144378 A1 | 6/2008 | Park | |
| 2008/0239812 A1 | 10/2008 | Abiko | |
| 2010/0207195 A1 | 8/2010 | Fukuzumi et al. | |
| 2011/0051527 A1 | 3/2011 | Kirisawa et al. | |
| 2012/0195119 A1 | 8/2012 | Nagadomi et al. | |
| 2012/0250420 A1 | 10/2012 | Shirakawa et al. | |
| 2012/0320678 A1 | 12/2012 | Maejima et al. | |
| 2013/0141971 A1 | 6/2013 | Hosono | |
| 2013/0242667 A1* | 9/2013 | Shim ................... | G11C 16/0483 365/185.19 |
| 2014/0085978 A1 | 3/2014 | Lee | |
| 2014/0286099 A1 | 9/2014 | Shirakawa | |
| 2014/0347933 A1 | 11/2014 | Lee | |
| 2015/0138882 A1 | 5/2015 | Han | |
| 2015/0162090 A1 | 6/2015 | Sakui | |
| 2015/0294724 A1 | 10/2015 | Nam | |
| 2015/0332783 A1 | 11/2015 | Jeong | |
| 2017/0179150 A1 | 6/2017 | Shimura | |
| 2018/0053774 A1 | 2/2018 | Sakamoto | |
| 2018/0068740 A1 | 3/2018 | Lee | |

FOREIGN PATENT DOCUMENTS

| | | |
|---|---|---|
| JP | 2009-146954 | 7/2009 |
| JP | 2010-118530 | 5/2010 |
| JP | 2010-199235 | 9/2010 |

OTHER PUBLICATIONS

Yosuke Komori et al., "Disturbless Flash Memory due to High Boost Efficiency on BiCS Structure and Optimal Memory Film Stack for Ultra High Density Storage Device", IEDM Technology Digest, 2008, 4 Pages.

Takashi Maeda et al., "Multi-stacked 1G cell/layer Pipe-shaped BiCS Flash Memory", Symposium on VLSI Circuits Digest of Technical Papers, 2009, 2 Pages.

Korean Office Action dated Aug. 30, 2012 in Korea Application No. 10-2011-0023747 (w/English translation).

Office Action dated Jun. 18, 2013 in Japanese Patent Application No. 2010-264872 filed Nov. 29, 2010 (w/English translation).

Japanese Office Action dated Mar. 4, 2014 in Patent Application No. 2010-264872 with English Translation.

\* cited by examiner

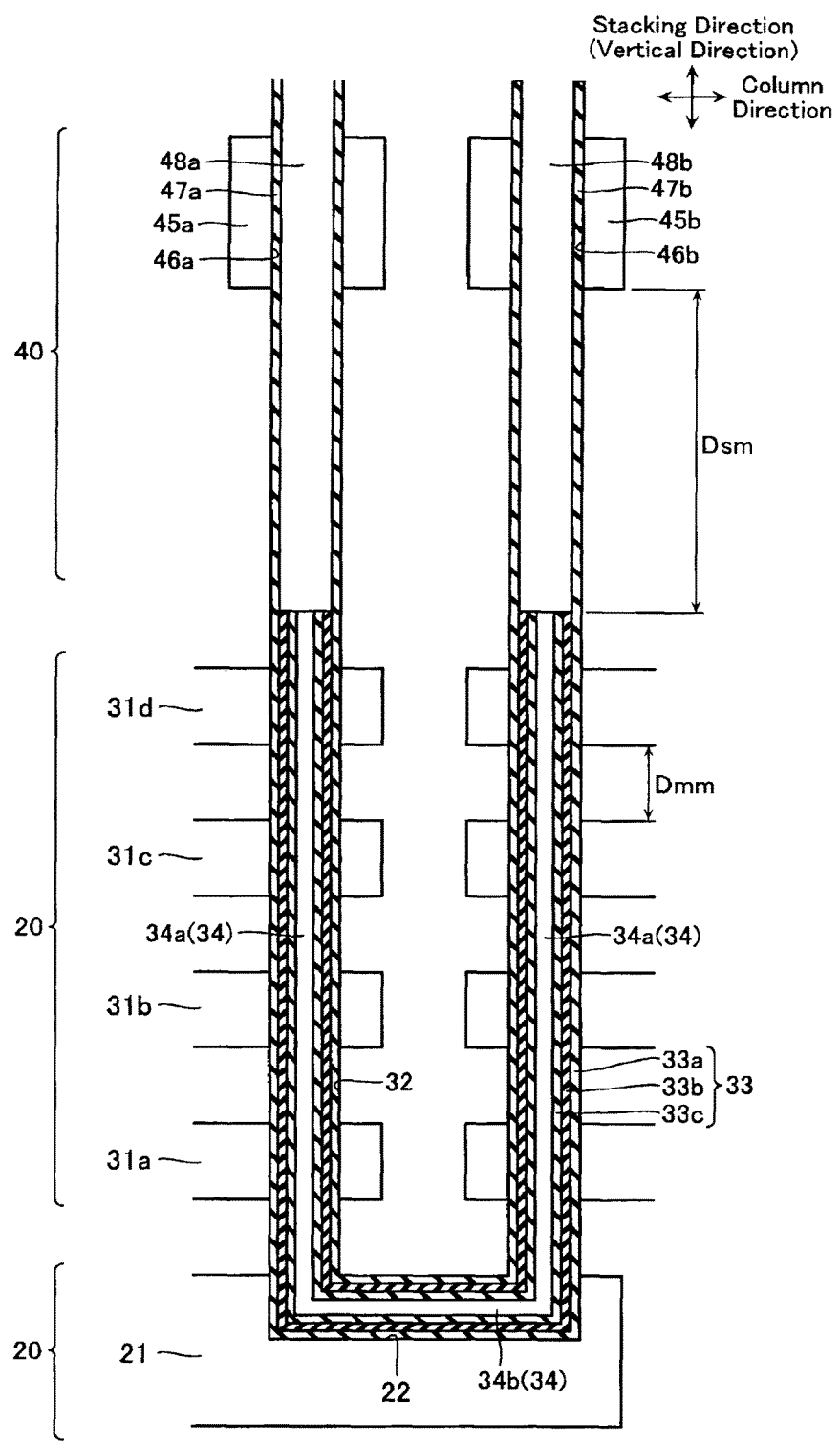

FIG. 15A
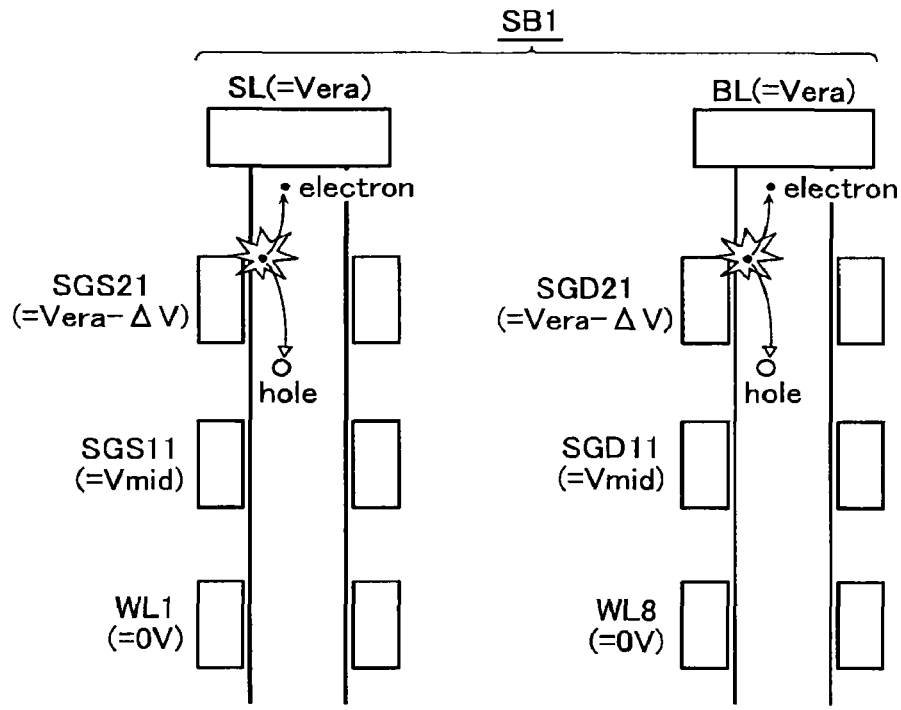
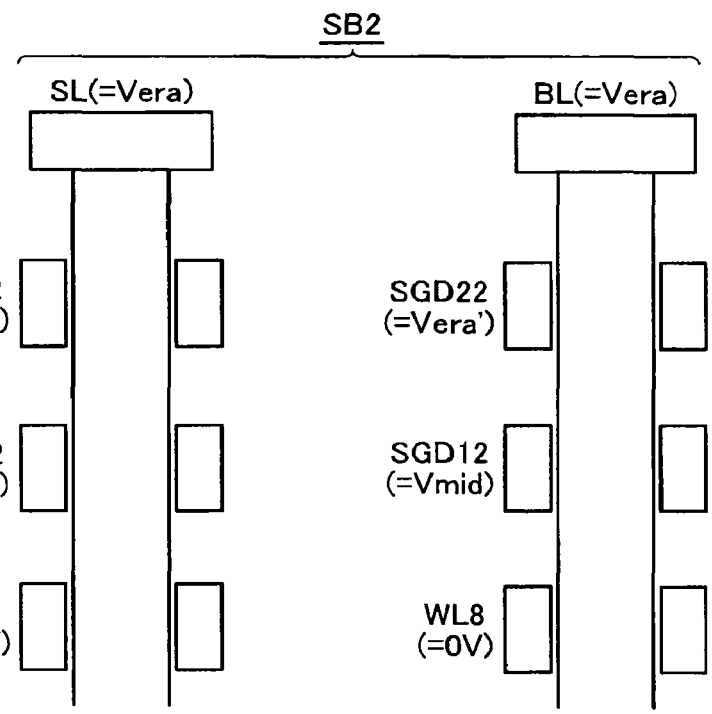

FIG. 16A
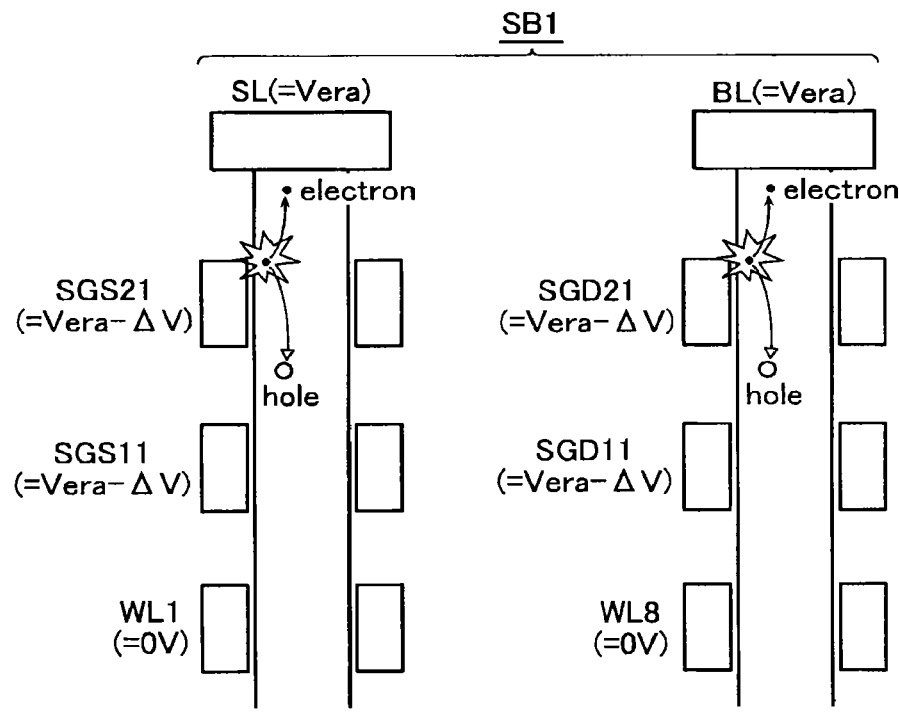
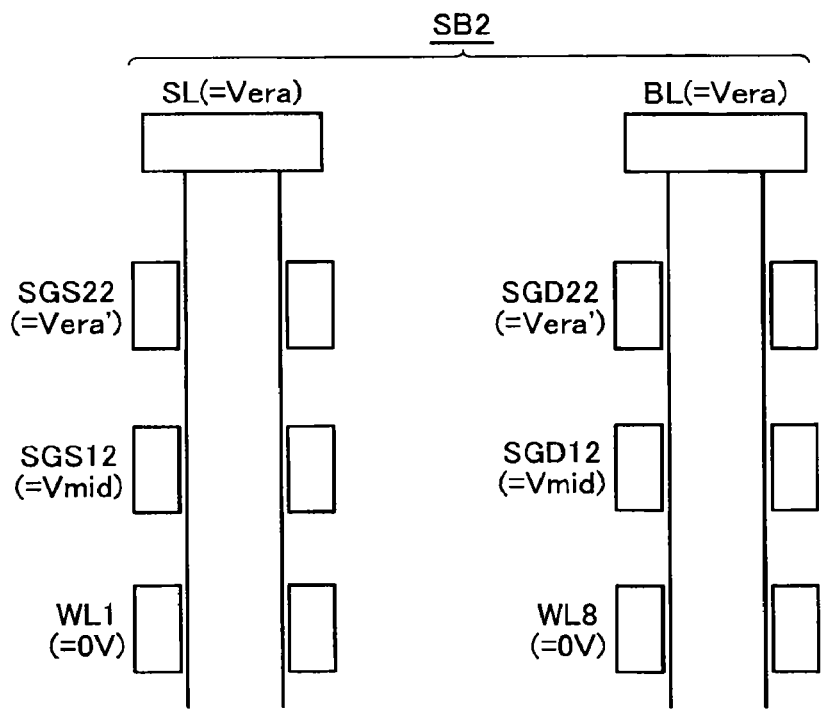

FIG. 23
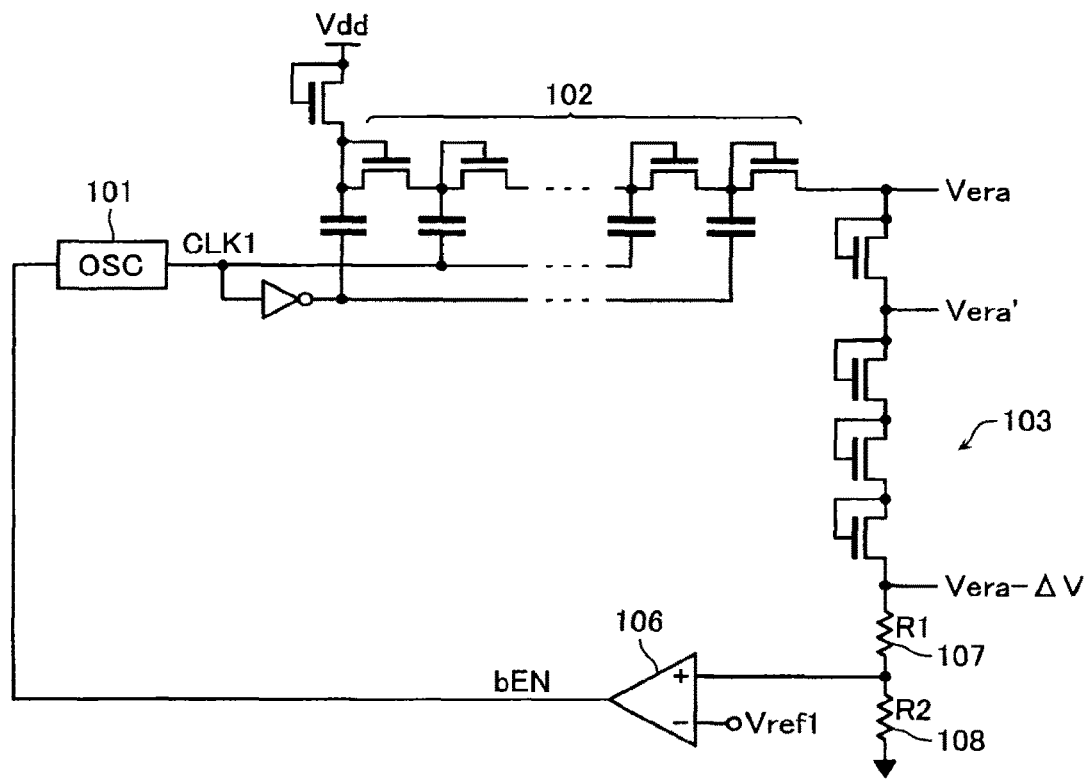
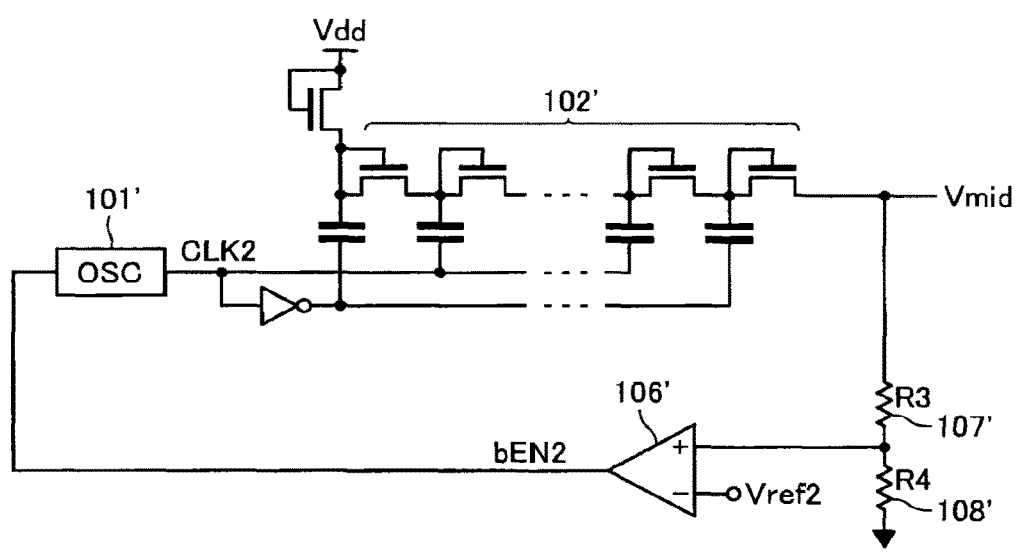

FIG. 27
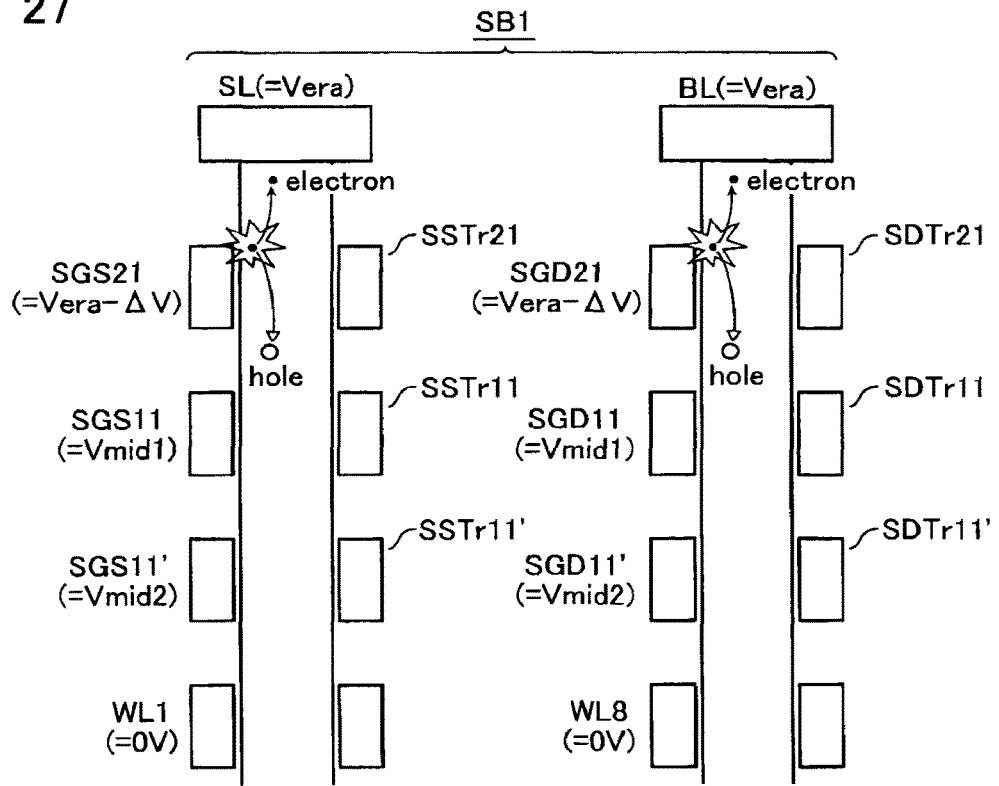
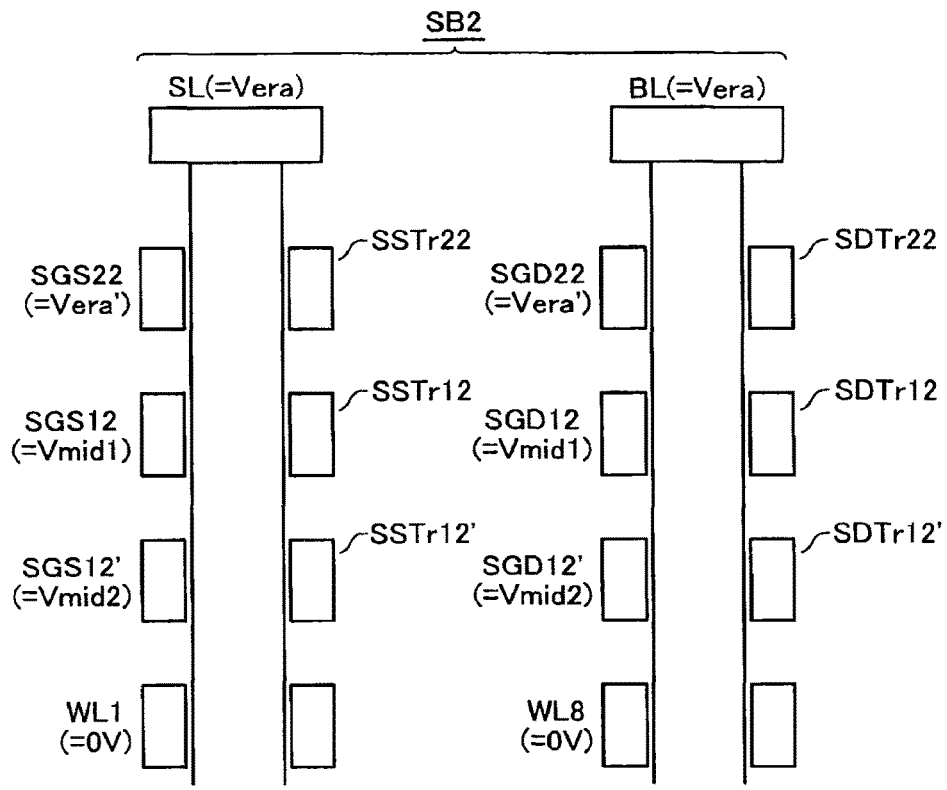

NONVOLATILE SEMICONDUCTOR MEMORY DEVICE

CROSS REFERENCE TO RELATED APPLICATIONS

This application is a continuation of and claims the benefit of priority under 35 U.S.C. § 120 from U.S. application Ser. No. 16/122,945 filed Sep. 6, 2018, which is a continuation of U.S. application Ser. No. 15/915,701 filed Mar. 8, 2018 (now U.S. Pat. No. 10,090,054 issued Oct. 2, 2018), which is a continuation of U.S. application Ser. No. 15/810,489 filed Nov. 13, 2017 (now U.S. Pat. No. 9,953,713 issued Apr. 24, 2018), which is a continuation of U.S. application Ser. No. 15/648,530 filed Jul. 13, 2017 (now U.S. Pat. No. 9,852,797 issued Dec. 26, 2017), which is a continuation of U.S. application Ser. No. 15/403,339 filed Jan. 11, 2017 (now U.S. Pat. No. 9,747,988 issued Aug. 29, 2017), which is a continuation of U.S. application Ser. No. 15/275,614 filed Sep. 26, 2016 (now U.S. Pat. No. 9,595,337 issued Mar. 14, 2017), which is a continuation of U.S. application Ser. No. 14/842,382 filed Sep. 1, 2015 (now U.S. Pat. No. 9,484,105 issued Nov. 1, 2016), which is a continuation of U.S. application Ser. No. 14/493,413 filed Sep. 23, 2014 (now U.S. Pat. No. 9,159,431 issued Oct. 13, 2015), which is a continuation of U.S. application Ser. No. 14/098,237 filed Dec. 5, 2013 (now U.S. Pat. No. 8,861,274 issued Oct. 14, 2014), which is a continuation of U.S. application Ser. No. 13/970,689 filed Aug. 20, 2013 (now U.S. Pat. No. 8,649,227 issued Feb. 11, 2014), which is a continuation of U.S. application Ser. No. 13/149,139 filed May 31, 2011 (now U.S. Pat. No. 8,537,615 issued Sep. 17, 2013), and claims the benefit of priority under 35 U.S.C. § 119 from Japanese Patent Application No. 2010-264872 filed Nov. 29, 2010, the entire contents of each of which are incorporated herein by reference.

FIELD

Embodiments described herein relate to a nonvolatile semiconductor memory device.

BACKGROUND

Conventionally, an LSI is formed by integrating elements in a two-dimensional plane on a silicon substrate. Generally, a storage capacity of memory is increased by reducing dimensions of (miniaturizing) an element. However, in recent years, even this miniaturization is becoming difficult in terms of cost and technology. Improvements in photo-lithographic technology are necessary for miniaturization, but costs required in lithographic processes are rapidly increasing. In addition, even if miniaturization is achieved, it is expected that physical limitations such as those of withstand voltage between elements are encountered, unless the drive voltage and so on are scaled. Moreover, the reduction in distance between memory elements that accompanies miniaturization causes an increase in adverse effects due to capacitive coupling between each of the memory elements during operations. In other words, there is a high possibility that operation as a device becomes difficult. Accordingly, in recent years, there are proposed many nonvolatile semiconductor memory devices (stacking-type nonvolatile semiconductor memory devices) in which memory cells are disposed three-dimensionally in order to increase a degree of integration of memory.

One conventional semiconductor memory device in which memory cells are disposed three-dimensionally uses a transistor with a cylindrical column type structure. The semiconductor memory device using the transistor with a cylindrical column type structure is provided with multiple layers of polysilicon configuring a gate electrode, and a pillar-shaped columnar semiconductor. The columnar semiconductor is disposed to penetrate the polysilicon layers and has a memory cell formed at portions of intersection with those polysilicon layers. In this memory cell, the columnar semiconductor functions as a channel (body) portion of a transistor. A vicinity of the columnar semiconductor is provided with a charge storage layer, each sandwiching a tunnel insulating layer and configured to store a charge. Furthermore, a block insulating layer is formed in a vicinity of the charge storage layer. The polysilicon, columnar semiconductor, tunnel insulating layer, charge storage layer and block insulating layer configured in this manner form a memory string of series-connected memory cells.

An erase operation in this kind of conventional semiconductor memory device in which memory cells are disposed three-dimensionally is performed in units of a memory block, the memory block being an assembly of memory strings to which word lines are commonly connected. In a conventional stacking-type semiconductor memory device, there is a problem that, along with an increase in the number of layers, there is an increase in the number of word lines commonly connected to a plurality of memory strings in one memory block, this leading to an increase in the number of memory cells included in one memory block. Consequently, there is desired a stacking-type semiconductor memory device which, in addition to being capable of the erase operation on a memory block basis, is also capable of an erase operation to selectively erase only a part of the memory cells in a memory block.

BRIEF DESCRIPTION OF THE DRAWINGS

FIG. 4 is a schematic cross-sectional view of a memory unit MU in one memory block MB.

FIG. 15A shows the erase operation in the second embodiment.

FIG. 16A shows an erase operation in a modified example in the second embodiment.

FIG. 23 is one example of a charge pump circuit optimal for generating various voltages in the fifth embodiment.

FIG. 27 shows an erase operation in the sixth embodiment.

DETAILED DESCRIPTION

Figure 1:
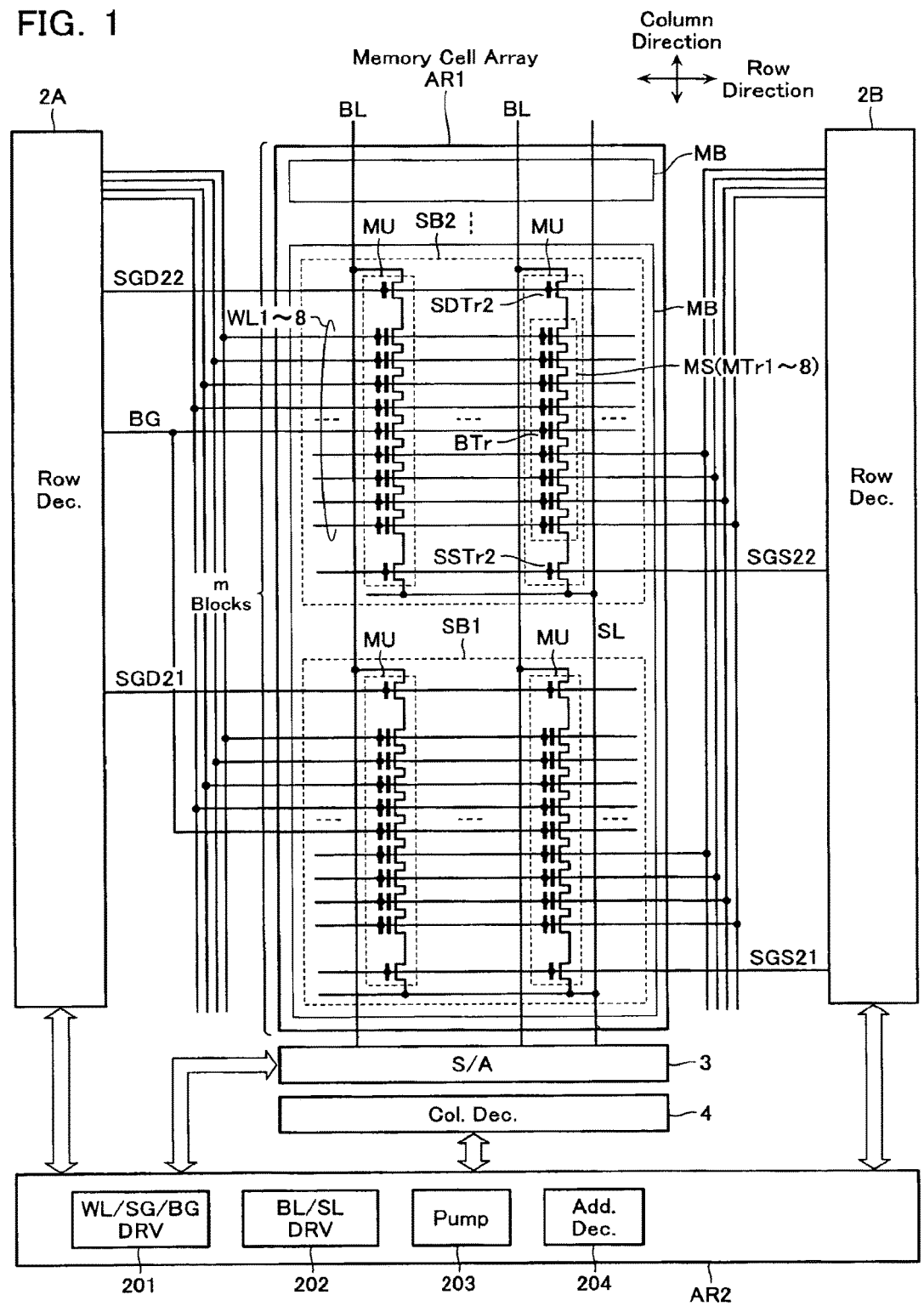
FIG. 1 is a circuit diagram showing an overall configuration of a nonvolatile semiconductor memory device in accordance with a first embodiment.

A nonvolatile semiconductor memory device in an embodiment described hereinafter comprises a memory cell array including a plurality of memory blocks. Arranged in each of the plurality of memory blocks are a plurality of memory strings disposed in a matrix and each configured from a plurality of electrically rewritable memory transistors connected in series. One end of a drain side select transistor is connected to a first end of the memory string, and one end of a source side select transistor is connected to a second end of the memory string. A plurality of word lines are disposed so as to be commonly connected to the plurality of memory strings disposed in one of the plurality of memory blocks. In addition, a plurality of bit lines each extends in a first direction and is commonly connected to the other end of the drain side select transistor in the plurality of memory blocks. A source line is connected to the other end of the source side select transistor. A drain side select gate line is disposed along a second direction as a longer direction thereof and so as to commonly connect a gate of the drain side select transistor aligned in the second direction, the second direction being orthogonal to the first direction. A source side select gate line is disposed along the second direction as a longer direction thereof and so as to commonly connect a gate of the source side select transistor aligned in the second direction. A control circuit controls a voltage applied to the plurality of memory blocks.

Each of the plurality of memory strings comprises: a columnar semiconductor layer including a columnar portion extending in a perpendicular direction with respect to a substrate, the columnar semiconductor layer being configured to function as a body of the memory transistors; a charge storage layer formed so as to surround a side surface of the columnar portion and configured to allow storage of a charge; and a word line conductive layer formed so as to surround the side surface of the columnar portion with the charge storage layer interposed therebetween, the word line conductive layer being configured to function as a gate of the memory transistors and as the word lines. A plurality of the memory strings that are connected to a plurality of the drain side select transistors and a plurality of the source side select transistors which are commonly connected to one of the drain side select gate lines and one of the source side select gate lines configure one sub-block. For execution of an erase operation of selectively erasing at least one of the sub-blocks in the memory blocks, the control circuit is configured to apply, in a first sub-block as a selected sub-block, a first voltage to the bit lines and the source line, and a second voltage smaller than the first voltage to the word lines. Then, the control circuit applies a third voltage lower than the first voltage by a certain value to the drain side select gate line and the source side select gate line, thereby performing the erase operation in the first sub-block. On the other hand, the control circuit applies, in a second sub-block as an unselected sub-block existing in an identical memory block to the selected sub-block, a fourth voltage substantially identical to the first voltage to the drain side select gate line and the source side select gate line, thereby not performing the erase operation in the second sub-block.

Embodiments of a nonvolatile semiconductor memory device in accordance with the present invention are described below with reference to the drawings.

First Embodiment

First, an overall configuration of a nonvolatile semiconductor memory device in accordance with a first embodiment is described with reference to FIG. 1. FIG. 1 is a circuit diagram of the nonvolatile semiconductor memory device in accordance with the first embodiment.

As shown in FIG. 1, the nonvolatile semiconductor memory device in accordance with the first embodiment includes a memory cell array AR1 and, disposed in a periphery of that memory cell array AR1, row decoders 2A and 2B, a sense amplifier circuit 3, a column decoder 4, and a control circuit AR2.

As shown in FIG. 1, the memory cell array AR1 is configured having a plurality of memory strings MS arranged in a matrix, each of the memory strings MS having electrically rewritable memory transistors MTr1-8 (memory cells) connected in series. The control circuit AR2 is configured by various kinds of control circuits configured to control a voltage applied to gates of the memory transistors MTr (MTr1-8), and so on.

The row decoders 2A and 2B are disposed on the left side and right side, respectively, of the memory cell array AR1, and, in accordance with an address signal from the control circuit AR2, drive word lines WL, select gate lines SGD and SGS, and a back gate line BG. The column decoder 4 selects an address where read and write are to be performed, in accordance with an address signal supplied from the control circuit AR2. The sense amplifier circuit 3 determines data stored in memory cells during a read operation. In addition, the sense amplifier 3 drives bit lines BL and a source line SL in accordance with an address signal supplied from the control circuit AR2 via the column decoder 4.

The control circuit AR2 comprises: a driver 201 configured to drive the word lines WL, the select gate lines SGD and SGS, and the back gate line BG; a driver 202 configured to drive the source line SL; a charge pump circuit 203 configured to boost a power supply voltage to a certain boost voltage; and an address decoder 204.

The control circuit AR2 executes a write operation of data to the memory transistors MTr, an erase operation of data in the memory transistors MTr, and the read operation of data from the memory transistors MTr. Voltages applied to the memory transistors MTr during the write operation and the read operation are substantially similar to those in a conventional stacking-type flash memory.

As shown in FIG. 1, the memory cell array AR1 includes memory blocks MB. Each of the memory blocks MB includes memory units MU arranged in an n column by two row matrix, for example. Each of the memory units MU comprises: the memory string MS; a source side select transistor SSTr2 connected to a source side of the memory string MS; a drain side select transistor SDTr2 connected to a drain side of the memory string MS; and a back gate transistor BTr. Note that, in the example shown in FIG. 1, a first row of memory units MU is referred to as a sub-block SB1, and a second row of memory units is referred to as a sub-block SB2. In FIG. 1, the case is described where there are two sub-blocks SB1 and SB2 in one memory block MB. However, naturally, the present embodiment is not limited to this case, and there may be three or more sub-blocks provided to one memory block MB.

The m memory blocks MB share identical bit lines BL. That is, each of the bit lines BL extends in a column direction shown in FIG. 1 and is connected to the plurality of memory units MU (drain side select transistors SDTr2) arranged in a line in the column direction in each of the m memory blocks MB. Two memory units MU aligned in the column direction in each of the memory blocks MB are commonly connected to an identical bit line BL.

In addition, 2×n memory units MU in each of the memory blocks MB share the word lines WL and the back gate line BG. Moreover, the n memory units MU aligned in a row direction (that is, the memory units MU in one sub-block) share a select gate line SGD and a select gate line SGS. That is, a plurality of the memory strings MS connected to a plurality of the drain side select transistors SDTr and a plurality of the source side select transistors SSTr commonly connected to one of the drain side select gate lines SGD and one of the source side select gate lines SGS configure one sub-block.

Figure 2:
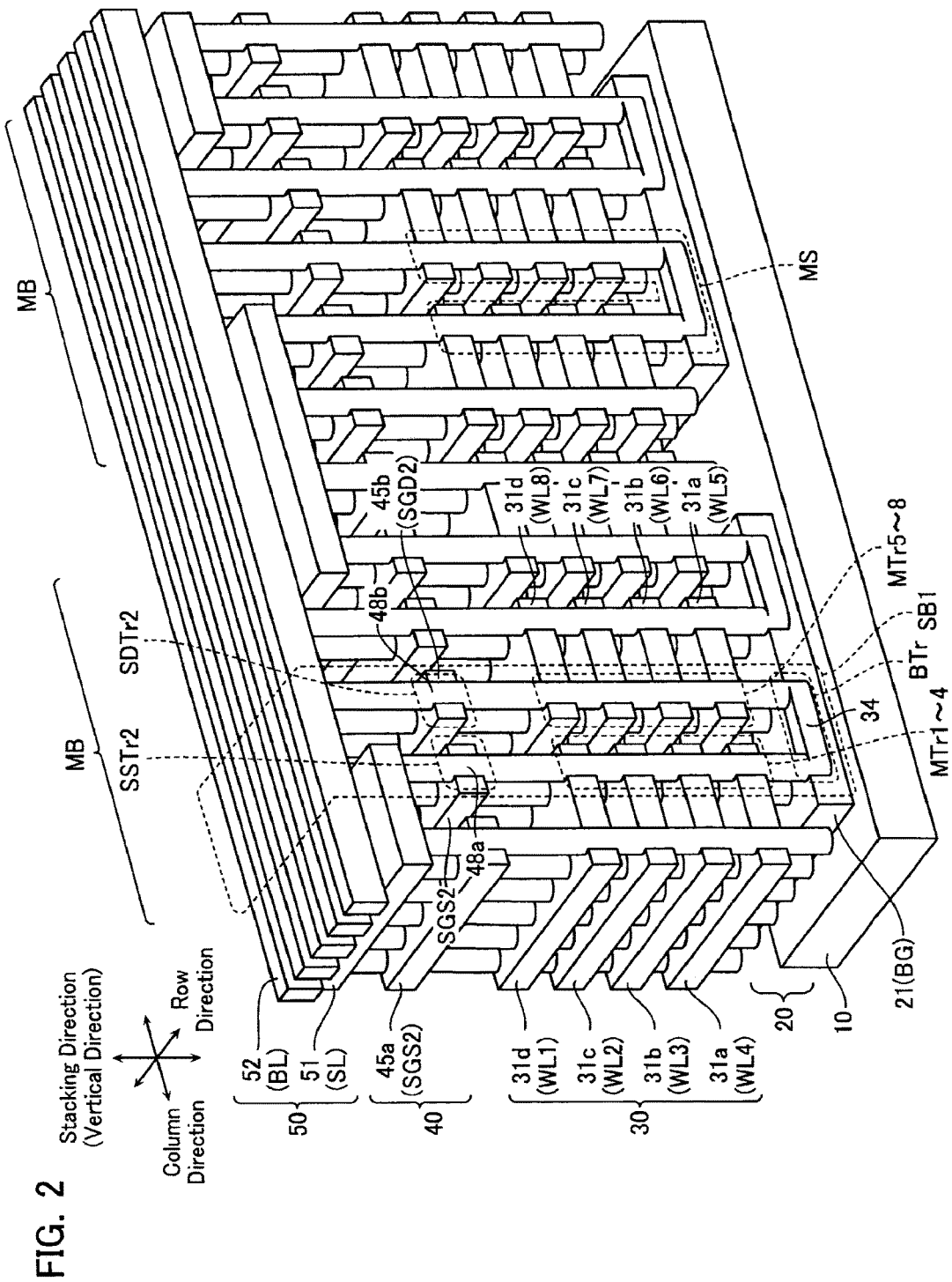
FIG. 2 is a schematic perspective view of a memory cell array AR1 in FIG. 1.

As shown in a schematic perspective view of FIG. 2, the memory cell array AR1 is configured having the electrically data-storing memory transistors MTr arranged in a three-dimensional matrix. That is, the memory transistors MTr, in addition to being arranged in a matrix in a horizontal direction, are also arranged in a stacking direction (vertical direction with respect to a substrate). The plurality of memory transistors MTr1-8 aligned in the stacking direction are connected in series to configure the aforementioned memory string MS. To determine select/unselect of the memory string MS, the drain side select transistor SDTr2 is connected to one end of the memory string MS and the source side select transistor SSTr2 is connected to the other end of the memory string MS. This memory string MS is arranged having the stacking direction as a longer direction thereof. Note that details of a stacking structure are described later.

Figure 3A:
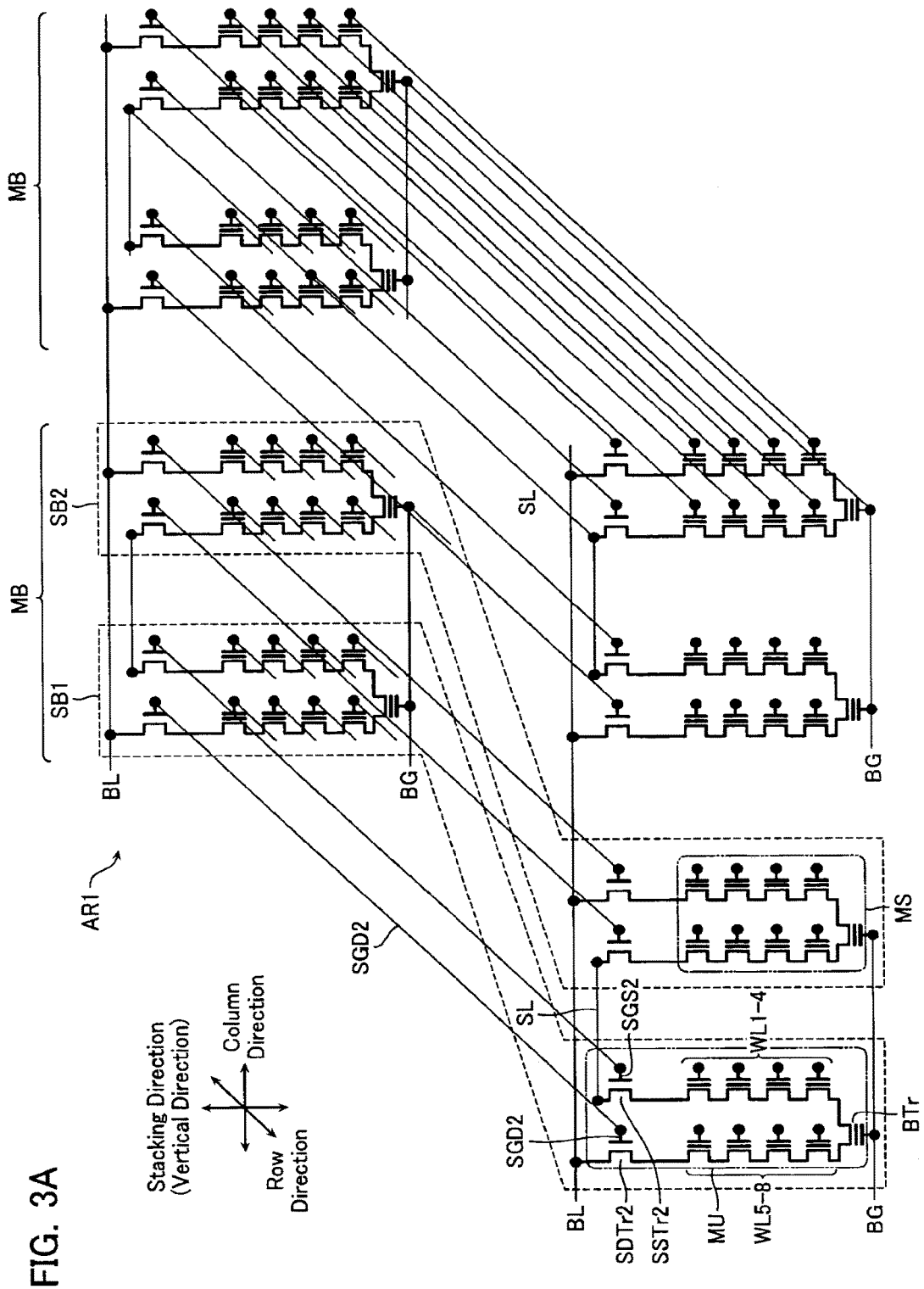
FIG. 3A is an equivalent circuit diagram showing a circuit configuration of the memory cell array AR1 in FIG. 1.

Next, a circuit configuration of the memory cell array AR1 is described specifically with reference to FIG. 3A. FIG. 3A is an equivalent circuit diagram of the memory cell array AR1.

As shown in FIG. 3A, the memory cell array AR1 includes a plurality of the memory units MU arranged in a matrix in the row direction and the column direction. In the memory block MB, a plurality of commonly connected memory units MU are provided to one bit line BL. Each of the memory units MU includes the memory string MS, the source side select transistor SSTr2, and the drain side select transistor SDTr2. The memory units MU are arranged in a matrix in the row direction and the column direction.

The memory string MS is configured by the memory transistors MTr1-8 and the back gate transistor BTr connected in series. The memory transistors MTr1-4 are connected in series in the stacking direction. Similarly, the memory transistors MTr5-8 are also connected in series in the stacking direction. The memory transistors MTr1-8 are configured to have a threshold voltage changed with an amount of charge stored in a charge storage layer. Changing the threshold voltage allows data retained in the memory transistors MTr1-8 to be rewritten. The back gate transistor BTr is connected between the lowermost layer memory transistors MTr4 and MTr5. The memory transistors MTr1-MTr8 and the back gate transistor BTr are thus connected in a U shape in a cross-section in the column direction. A drain of the source side select transistor SSTr2 is connected to one end of the memory string MS (a source of the memory transistor MTr8). A source of the drain side select transistor SDTr2 is connected to the other end of the memory string MS (a drain of the memory transistor MTr1).

Gates of the 2×n memory transistors MTr1 in one memory block MB are commonly connected to a single word line WL1 extending in the row direction. Similarly, gates of the 2×n memory transistors MTr2-MTr8 are commonly connected to respective single word lines WL2-WL8 extending in the row direction, respectively. Moreover, gates of the 2×n back gate transistors BTr arranged in a matrix in the row direction and the column direction are commonly connected to a back gate line BG.

Gates of the n source side select transistors SSTr2 arranged in a line in the row direction are commonly connected to a single source side select gate line SGS2 extending in the row direction. Moreover, sources of the source side select transistors SSTr2 are connected to the source line SL extending in the row direction.

Gates of the n drain side select transistors SDTr2 arranged in a line in the row direction are commonly connected to a single drain side select gate line SGD2 extending in the row direction. Drains of the drain side select transistors SDTr2 are connected to the bit line BL extending in the column direction.

Figure 3B:
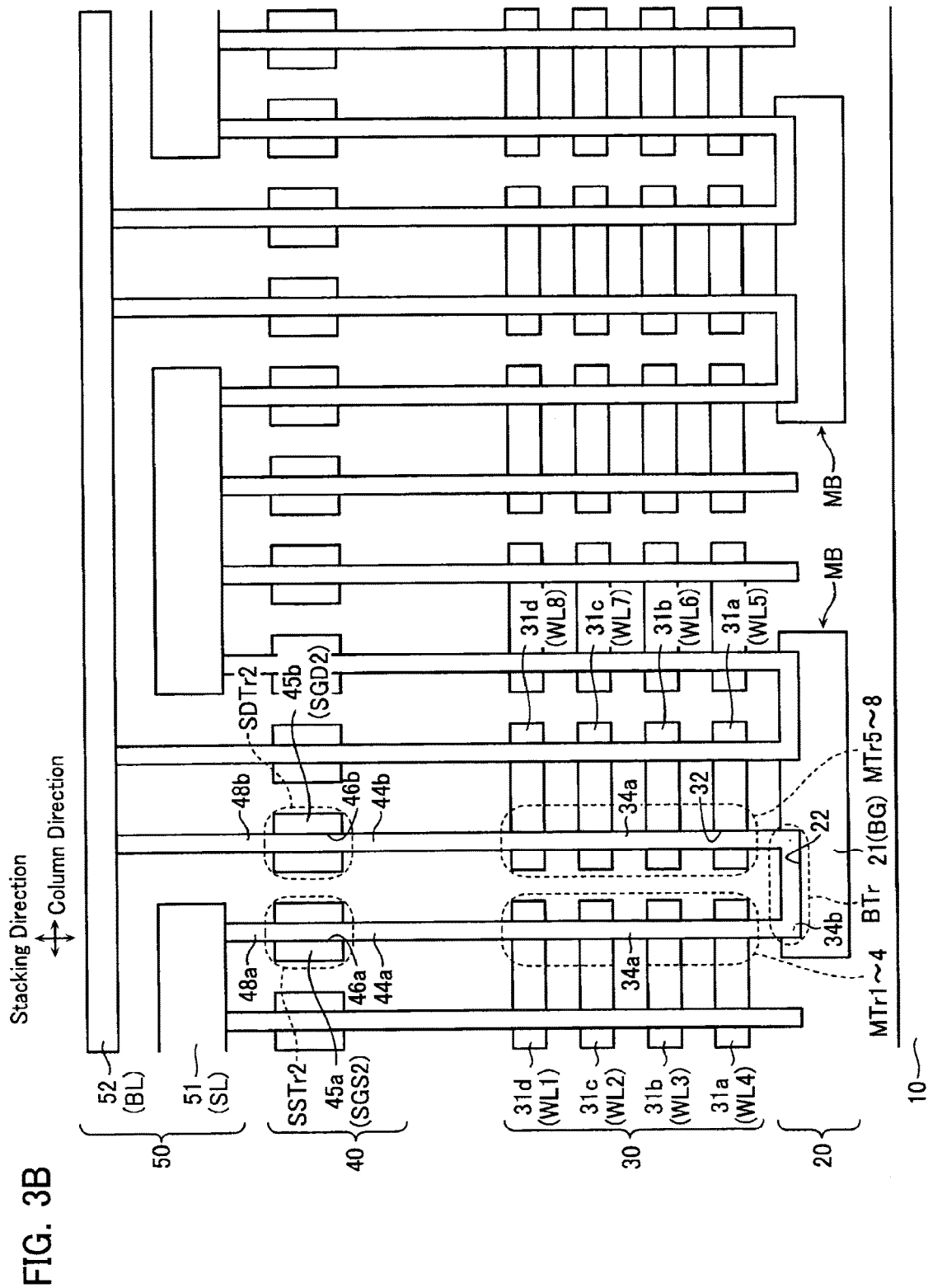
FIG. 3B is a schematic cross-sectional view of a memory block MB in the memory cell array AR1 in FIG. 1.
Figure 5:
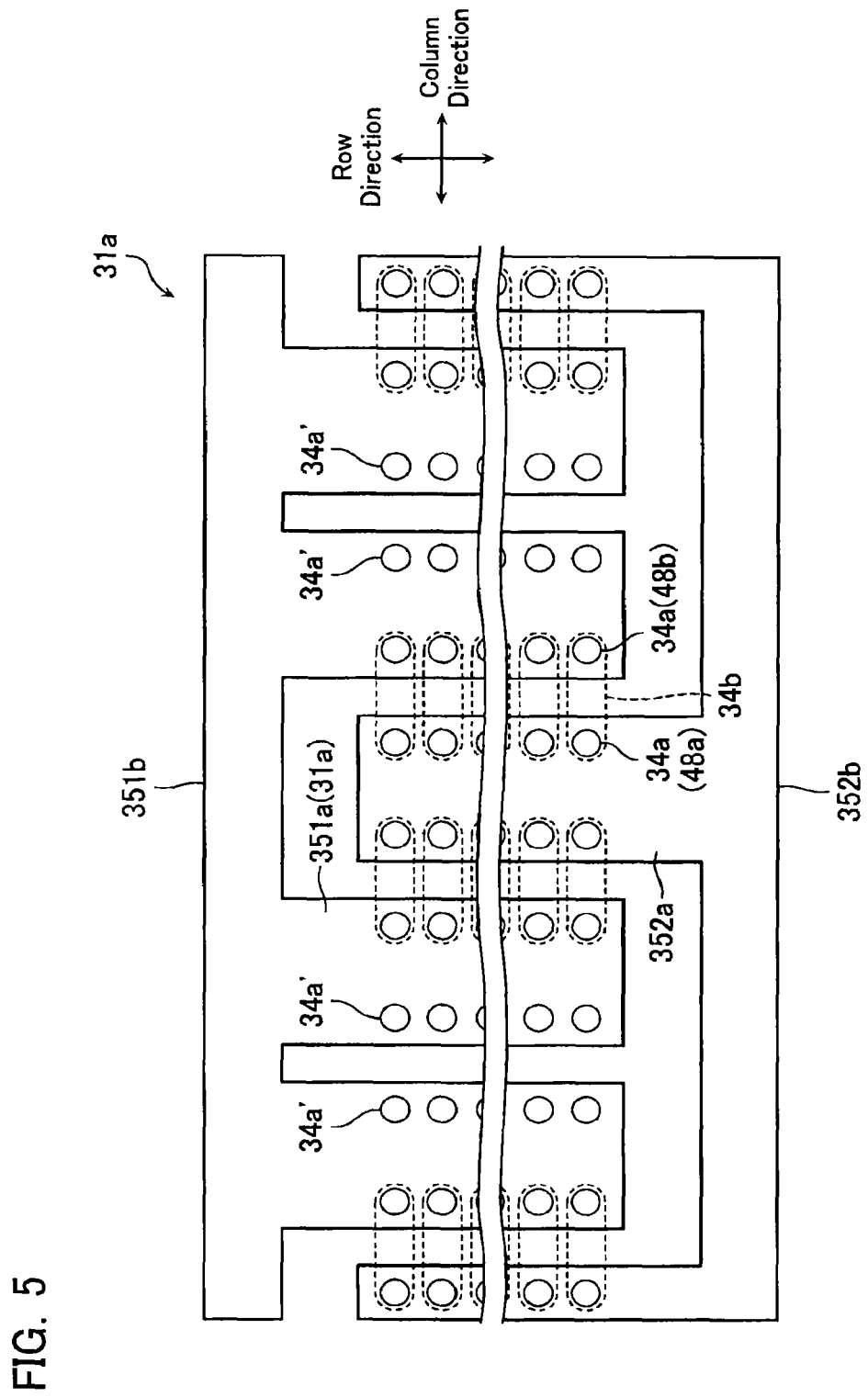
FIG. 5 is a plan view of one memory block MB.

Next, the stacking structure of the nonvolatile semiconductor memory device in accordance with the first embodiment is described with reference to FIGS. 3B, 4, and 5. FIG. 3B is a schematic column-direction cross-sectional view of the memory block MB. In addition, FIG. 4 is a schematic cross-sectional view of one memory unit MU, and FIG. 5 is a plan view of the memory block MB.

As shown in FIG. 3B, the memory cell array AR1 includes, on a substrate 10, a back gate transistor layer 20, a memory transistor layer 30, a select transistor layer 40, and a wiring layer 50. The back gate transistor layer 20 functions as the back gate transistor BTr. The memory transistor layer 30 functions as the memory transistors MTr1-MTr8 (memory string MS). The select transistor layer 40 functions as the source side select transistor SSTr2 and the drain side select transistor SDTr2. The wiring layer 50 functions as the source line SL and the bit line BL.

As shown in FIG. 4, the back gate transistor layer 20 includes a back gate conductive layer 21. The back gate conductive layer 21 functions as the back gate line BG and also functions as a gate of the back gate transistor BTr.

The back gate conductive layer 21 is formed so as to extend two-dimensionally in the row direction and the column direction parallel to the substrate 10. The back gate conductive layer 21 is divided on a memory block MB basis. The back gate conductive layer 21 is configured by polysilicon (poly-Si).

As shown in FIG. 4, the back gate transistor layer 20 includes a back gate hole 22. The back gate hole 22 is formed so as to dig out the back gate conductive layer 21. The back gate hole 22 is formed in a substantially rectangular shape long in the column direction as viewed from an upper surface. The back gate hole 22 is formed in a matrix in the row direction and the column direction.

As shown in FIG. 4, the memory transistor layer 30 is formed in a layer above the back gate transistor layer 20. The memory transistor layer 30 includes word line conductive layers 31a-31d. The word line conductive layers 31a-31d respectively function as the word lines WL1-WL8 and also as gates of the memory transistors MTr1-MTr8.

The word line conductive layers 31a-31d are stacked sandwiching interlayer insulating layers (not shown) between them. The word line conductive layers 31a-31d are formed so as to extend with the row direction as a longer direction thereof and having a certain pitch in the column direction. The word line conductive layers 31a-31d are configured by polysilicon (poly-Si).

As shown in FIG. 3B, the memory transistor layer includes a memory hole 32. The memory hole 32 is formed so as to penetrate the word line conductive layers 31a-31d and the interlayer insulating layers not shown. The memory hole 32 is formed so as to align with an end vicinity in the column direction of the back gate hole 22.

Figure 3C:
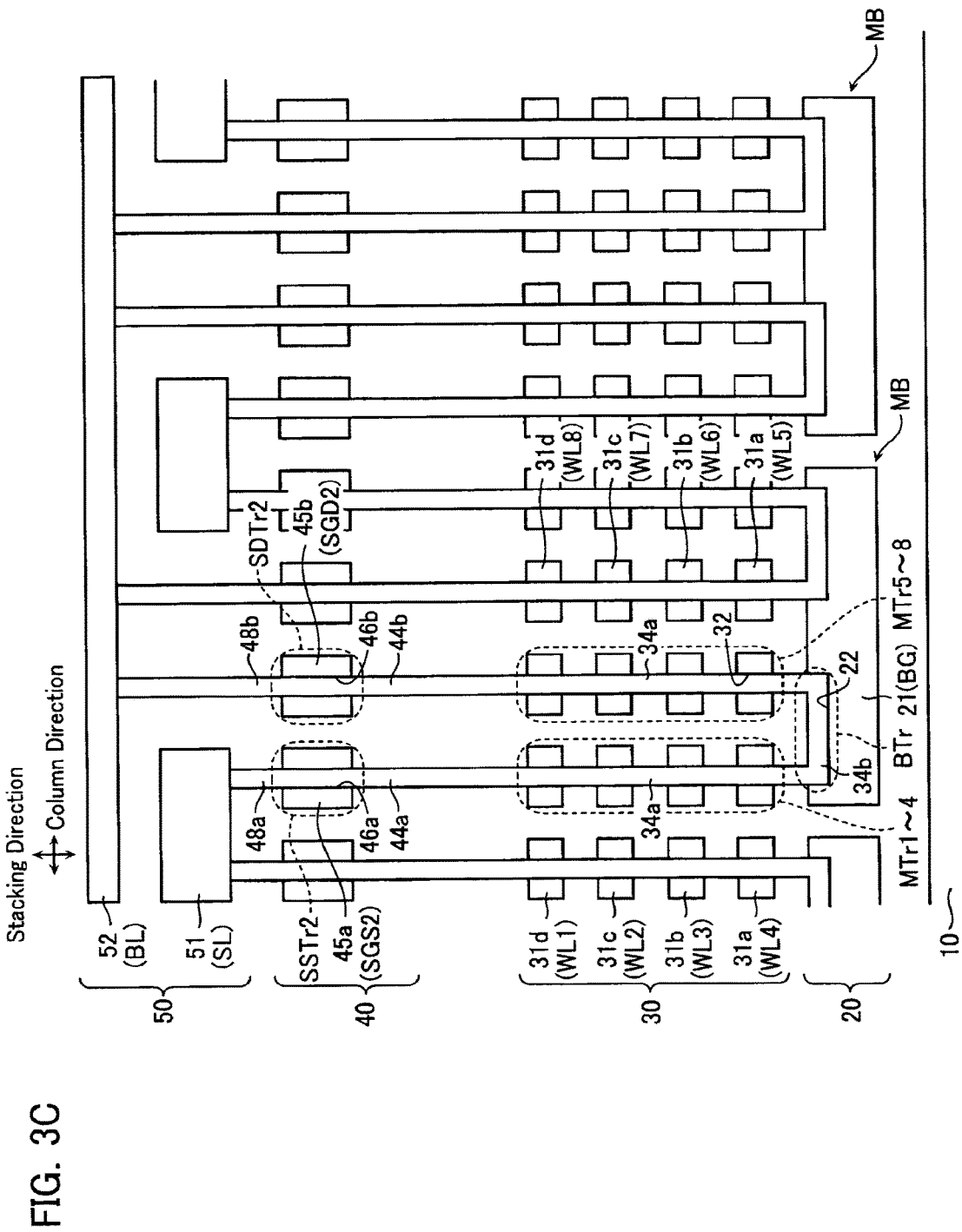
FIG. 3C is a schematic cross-sectional view of inside another memory cell array.

Note that FIG. 3B shows an example where two memory strings MS aligned in a bit line BL direction are commonly connected to the same word line conductive layers 31a-31d. However, as shown in FIG. 3C, a configuration may also be adopted in which memory strings MS aligned in the bit line BL direction are connected to word line conductive layers 31a-31d divided from each other on a memory string MS basis.

In addition, as shown in FIG. 4, the back gate transistor layer 20 and the memory transistor layer 30 include a memory gate insulating layer 33 and a memory semiconductor layer 34. The memory semiconductor layer 34 functions as a body of the memory transistors MTr1-MTr8 (memory string MS).

As shown in FIG. 4, the memory gate insulating layer 33 is formed with a certain thickness on a side surface of the back gate hole 22 and the memory hole 32. The memory gate insulating layer 33 includes a block insulating layer 33a, a charge storage layer 33b, and a tunnel insulating layer 33c. Storing of a charge by the charge storage layer 33b causes the threshold voltage of the memory transistors MTr1-8 to change, thus allowing data retained by the memory transistors MTr to be rewritten.

As shown in FIG. 4, the block insulating layer 33a is formed with a certain thickness on the side surface of the back gate hole 22 and the memory hole 32. The charge storage layer 33b is formed with a certain thickness on a side surface of the block insulating layer 33a. The tunnel insulating layer 33c is formed with a certain thickness on a side surface of the charge storage layer 33b. The block insulating layer 33a and the tunnel insulating layer 33c are configured by silicon oxide ($SiO_2$). The charge storage layer 33b is configured by silicon nitride (SiN).

The memory semiconductor layer 34 is formed so as to be in contact with a side surface of the tunnel insulating layer 33c. The memory semiconductor layer is formed so as to fill the back gate hole 22 and the memory hole 32. The memory semiconductor layer 34 is formed in a U shape as viewed from the row direction. The memory semiconductor layer 34 includes a pair of columnar portions 34a extending in the vertical direction with respect to the substrate 10 and a joining portion 34b configured to join lower ends of the pair of columnar portions 34a. The memory semiconductor layer 34 is configured by polysilicon (poly-Si).

Expressing the above-described configuration of the back gate transistor layer 20 in other words, the memory gate insulating layer 33 is formed so as to surround the joining portion 34b. The back gate conductive layer 21 is formed so as to surround the joining portion 34b with the memory gate insulating layer 33 interposed therebetween. In addition, expressing the above-described configuration of the memory transistor layer 30 in other words, the memory gate insulating layer 33 is formed so as to surround the columnar portion 34a. The word line conductive layers 31a-31d are formed so as to surround the columnar portion 34a with the memory gate insulating layer 33 interposed therebetween.

As shown in FIG. 3B, the select transistor layer 40 includes a source side conductive layer 45a and a drain side conductive layer 45b. The source side conductive layer 45a functions as the source side select gate line SGS2 and also functions as a gate of the source side select transistor SSTr2. The drain side conductive layer 45b functions as the drain side select gate line SGD2 and also functions as a gate of the drain side select transistor SDTr2.

The source side conductive layer 45a is formed so as to surround a semiconductor layer 48a, and the drain side conductive layer 45b, which is in the same layer as the source side conductive layer 45a, is formed similarly so as to surround a semiconductor layer 48b. The source side conductive layer 45a and the drain side conductive layer 45b are configured by polysilicon (poly-Si).

As shown in FIG. 4, the select transistor layer 40 includes a source side hole 46a and a drain side hole 46b. The source side hole 46a is formed so as to penetrate the source side conductive layer 45a. The drain side hole 46b is formed so as to penetrate the drain side conductive layer 45b. The source side hole 46a and the drain side hole 46b are each formed at a position aligning with the memory hole 32.

As shown in FIG. 4, the select transistor layer 40 includes a source side gate insulating layer 47a, a source side columnar semiconductor layer 48a, a drain side gate insulating layer 47b, and a drain side columnar semiconductor layer 48b. The source side columnar semiconductor layer 48a functions as a body of the source side select transistor SSTr2. The drain side columnar semiconductor layer 48b functions as a body of the drain side select transistor SDTr2.

Note that a distance Dsm between the source side conductive layer 45a or drain side conductive layer 45b and the word line conductive layer 31d is, for example, about two to three times a distance Dmm between adjacent word line conductive layers 31a-31d. This is to prevent a false erase operation. That is, during the erase operation, as described later, a high voltage is applied to the source side conductive layer 45a or drain side conductive layer 45b, while a ground voltage Vss is applied to the word line conductive layers 31a-31d. In this case, the columnar semiconductor layer 48a or 48b directly below the source side conductive layer 45a or drain side conductive layer 45b rises close to an erase voltage Vera due to capacitive coupling, while a potential of the columnar portion 34a directly below the word line conductive layer 31d remains at substantially 0 V. Therefore, if the distance between the source side conductive layer 45a or drain side conductive layer 45b and the word line conductive layer 31d is short, a strong electric field is generated between the columnar semiconductor layer 48a or 48b directly below the source side conductive layer 45a or drain side conductive layer 45b and the columnar portion 34a directly below the word line conductive layer 31d. This causes a GIDL current to be generated, whereby a false erase operation of data sometimes occurs in an unselected memory block. Consequently, the distance Dsm between the source side conductive layer 45a or drain side conductive layer 45b and the word line conductive layer 31d must be set larger than the distance Dmm between adjacent word line conductive layers 31a-31d.

As shown in FIG. 3B, the wiring layer 50 is formed in a layer above the select transistor layer 40. The wiring layer 50 includes a source line layer 51 and a bit line layer 52. The source line layer 51 functions as the source line SL. The bit line layer 52 functions as the bit line BL.

The source line layer 51 is formed in a plate-like shape extending in the row direction. The source line layer 51 is formed so as to be in contact with upper surfaces of pairs of the source side columnar semiconductor layers 48a adjacent in the column direction. The bit line layer 53, which is in contact with an upper surface of the drain side columnar semiconductor layer 48b, is formed in stripes extending in the column direction and having a certain pitch in the row direction. The source line layer 51 and the bit line layer 52 are configured by a metal such as tungsten (W), copper (Cu), or aluminum (Al).

Next, shapes of the word line conductive layers 31a-31d are described in detail with reference to FIG. 5. FIG. 5 is a top view showing the word line conductive layer 31a. FIG. 5 illustrates the shape of the word line conductive layer 31a only as an example, since the word line conductive layers 31b-31d have substantially the same shapes as the word line conductive layer 31a.

As shown in FIG. 5, the word line conductive layer 31a is formed in a comb tooth shape as viewed from a vertical direction. The word line conductive layer 31a have a plurality of straight portions 351a and 352a configured to surround a plurality of the columnar semiconductor layers 34a aligned in the row direction; and a straight portion 351b and 352b configured to join ends of the plurality of straight portions 351a and 352a. In this way, the word lines connected to memory strings MS aligned in the bit line direction are commonly connected to each other on a memory block basis. This is because there is a need to reduce the number of metal wiring lines for connecting signals of the word lines WL, select gate lines SGD and SGS, and back gate line BG to the likes of the row decoder in the peripheral circuit section.

In FIG. 5, a reference numeral 34a' denotes a dummy columnar semiconductor layer that is not used as a memory string MS. Note that, in the case of a configuration as in FIG. 3C, the dummy columnar semiconductor layer 34a' is not necessary.

Figure 6:
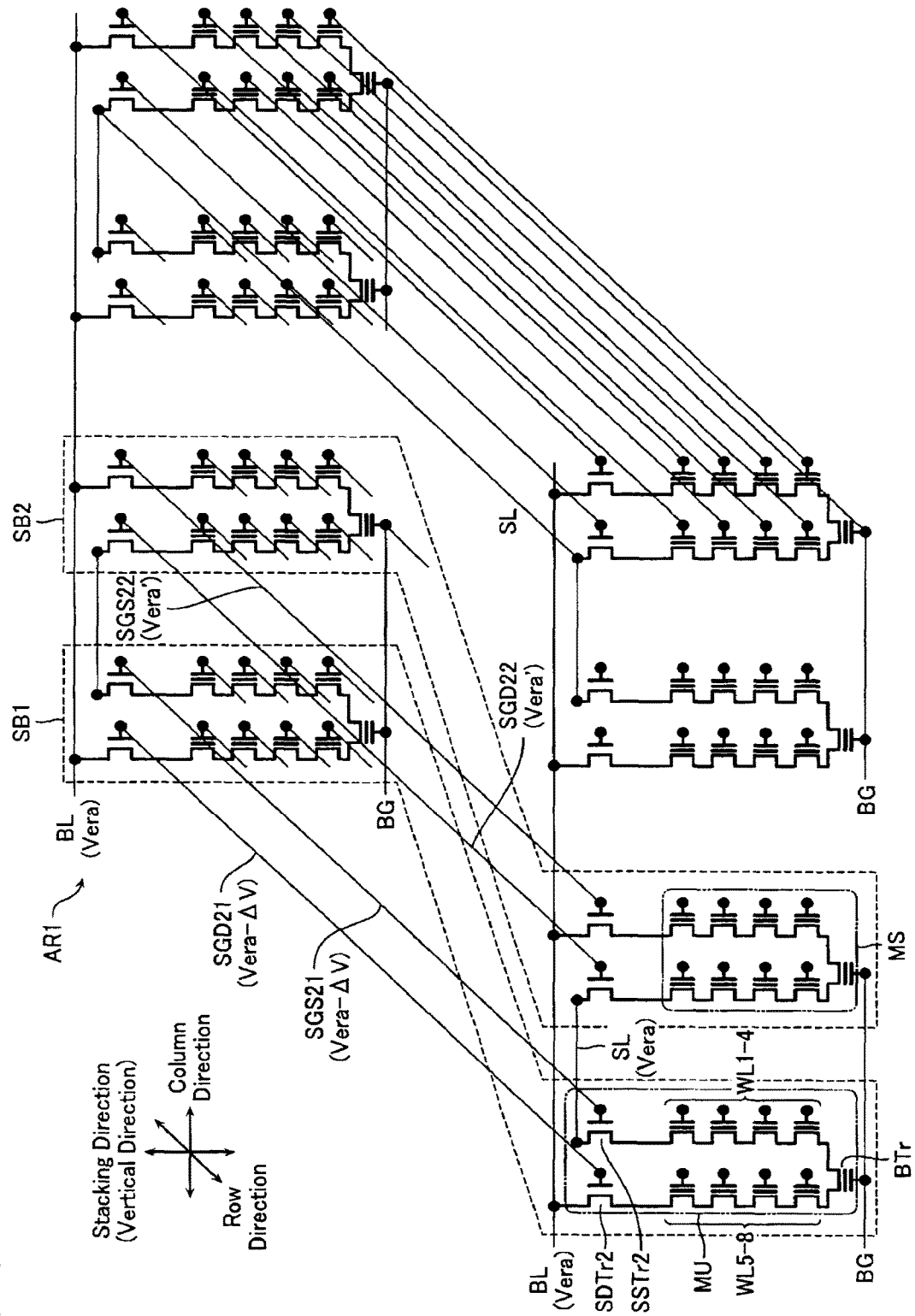
FIG. 6 shows an erase operation in the first embodiment.
Figure 7:
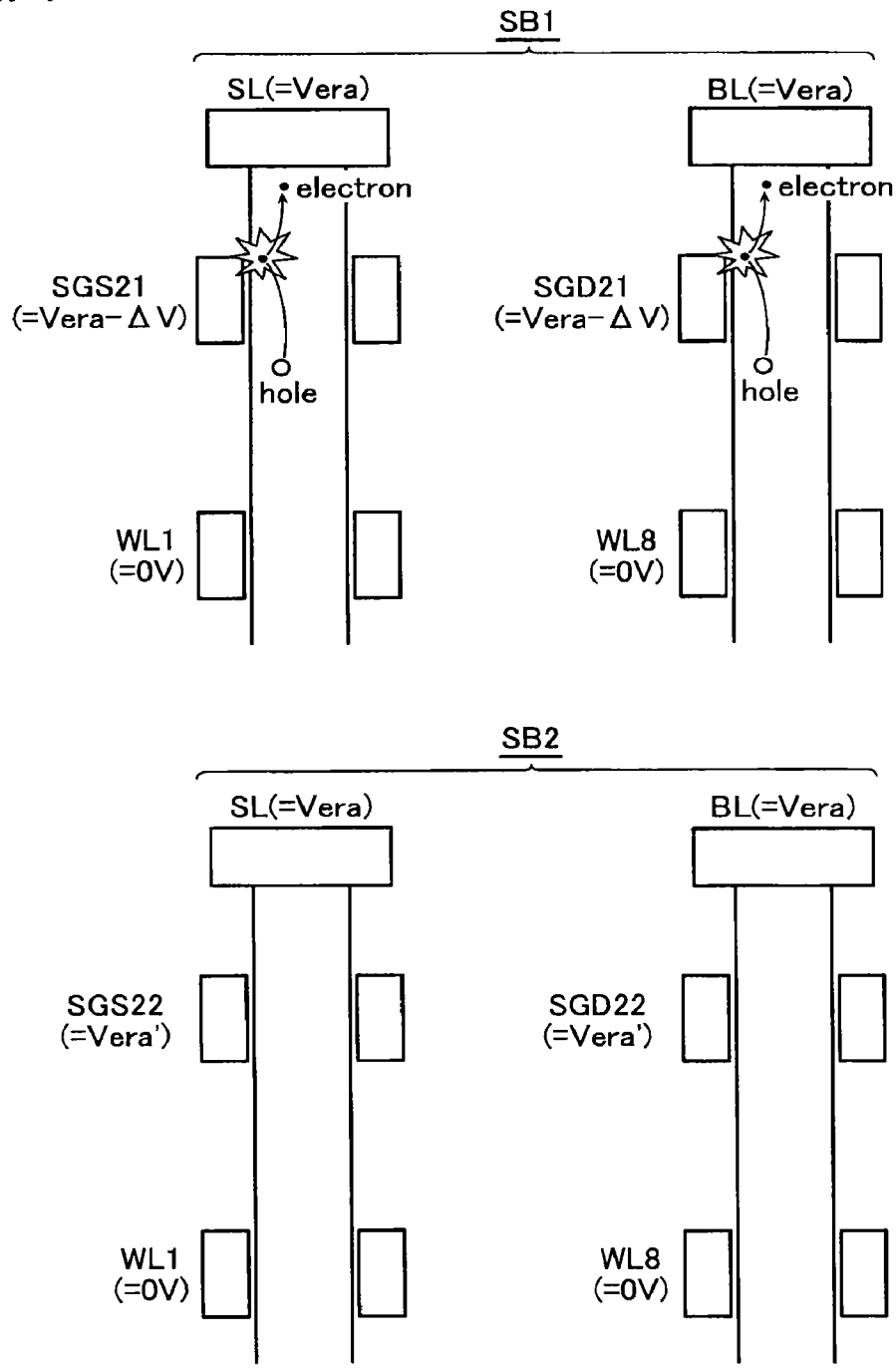
FIG. 7 shows the erase operation in the first embodiment.
Figure 8:
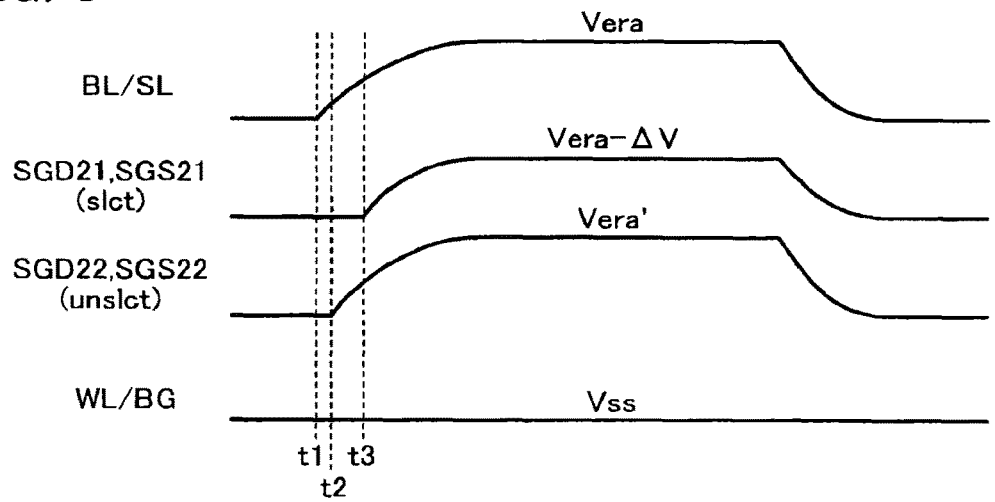
FIG. 8 shows the erase operation in the first embodiment.

Next, the erase operation in the nonvolatile semiconductor memory device in accordance with the present embodiment is described with reference to FIGS. 6-8. FIGS. 6 and 7 show an equivalent circuit diagram of the memory cell array AR1 and voltages applied to each part. FIG. 8 is a timing chart showing timing of application of voltages. Now, it is assumed that, of the two sub-blocks in one memory block MB, the sub-block SB1 is selectively set as erase target, and the erase operation executed in a sub-block unit on this sub-block SB1. At this time, the sub-block SB2 is not subject to erase, and erase of data in the memory cells in this sub-block SB2 is prohibited. The two sub-blocks SB1 and SB2 are both connected to identical bit lines BL, source line SL, and word lines WL, but each has a separate drain side select gate line SGD2 and source side select gate line SGS2. Note that in the description below, the select gate lines SGD2 and SGS2 in the sub-block SB1 are referred to as SGD21 and SGS21; similarly, the select gate lines SGD2 and SGS2 in the sub-block SB2 are referred to as SGD22 and SGS22.

As shown in FIG. 8, in the sub-block SB1 selected as erase target, at time t1, the bit lines BL and source line SL are each set to the erase voltage Vera (about 20 V). Meanwhile, the word lines WL are applied with the ground voltage Vss (0 V). Then, at time t3, the drain side select gate line SGD21 and the source side select gate line SGS21 are each applied with a voltage Vera-ΔV which is lower than the voltage Vera by about a voltage ΔV (for example, 5-8 V). This causes a GIDL (Gate Induced Drain Leakage) current to be generated at an end of the drain side select transistor SDTr2 on the bit line BL side and an end of the source side select transistor SSTr2 on the source line SL side in the sub-block SB1 (refer to FIG. 7), whereby the voltage Vera applied to the bit lines BL and source line SL is transferred to the body of the memory units MU in the sub-block SB1. This causes the erase operation in the sub-block SB1 to be executed as a result of a potential difference between the voltage Vera of the body and the voltage Vss of the word lines WL.

On the other hand, in the unselected erase-prohibited sub-block SB2, at time t1, the bit lines BL and source line SL, since they are shared with the sub-block SB1, are set to the erase voltage Vera (about 20 V). However, at time t2, the drain side select gate line SGD22 and the source side select gate line SGS22 are applied with a voltage Vera' substantially identical to the erase voltage Vera. As a result, a high voltage is not applied between the source line SL and source side select gate line SGS and between the bit lines BL and drain side select gate line SGD, whereby generation of a GIDL current is prevented.

Figure 9A:
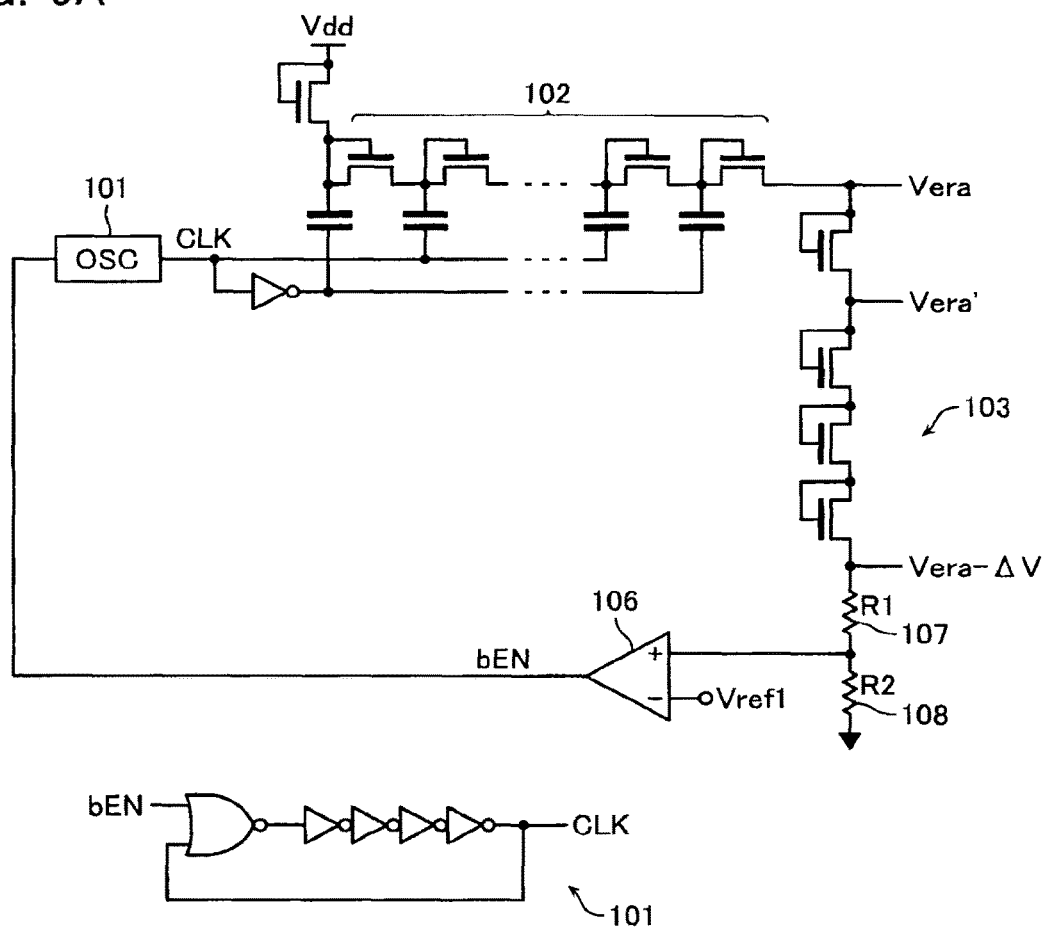
FIG. 9A is one example of a charge pump circuit and a voltage value adjusting circuit optimal for generating various voltages in the first embodiment.

FIG. 9A is one example of a charge pump circuit and a voltage value adjusting circuit optimal for generating various voltages in the present embodiment. An oscillator 101 generates a clock signal, and a charge pump circuit 102 is inputted with this clock signal and boosts a power supply voltage Vdd to the erase voltage Vera. Voltage values of the voltage Vera' and Vera-ΔV are adjusted by a voltage value adjusting circuit 103 configured having diode-connected transistors connected in series. In addition, a voltage determining circuit configured by a differential amplifier 106 and splitting resistances 107 and 108 judges whether the voltage Vera has risen to a certain value or not, and stops operation of the oscillator 101 based on an output signal of the differential amplifier 106.

Figure 9B:
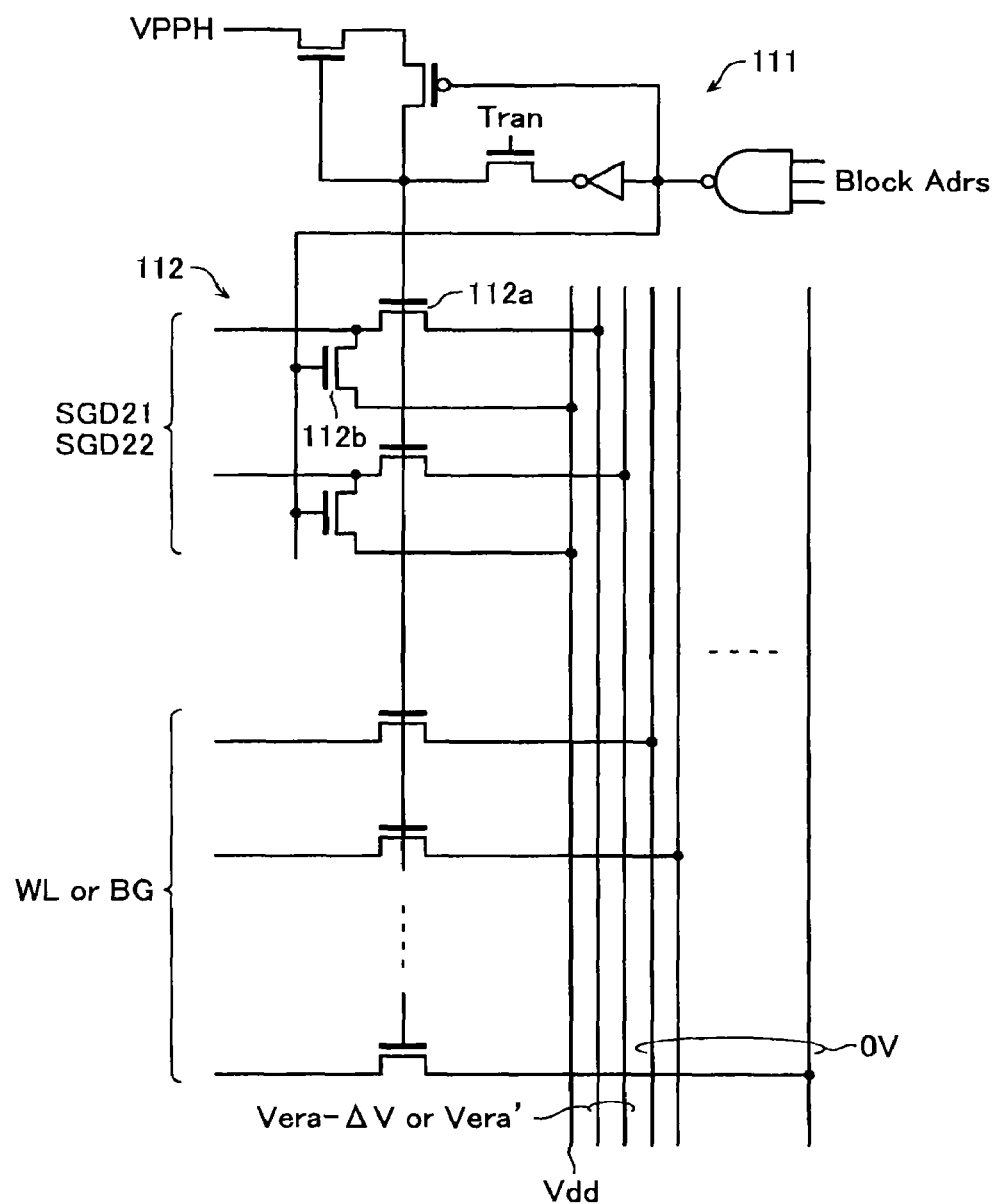
FIG. 9B is one example of a row decoder 2A employed in the first embodiment.

Note that in the selected memory block, the above-mentioned voltage is supplied to the select gate lines SGD2 and SGS2; however, in the unselected memory block, it is preferable for the select gate lines SGD2 and SGS2 to be maintained in the floating state. One example of the row decoder 2A for performing such voltage control is shown in FIG. 9B (the row decoder 2B has a substantially similar configuration, hence only the row decoder 2A is described). This row decoder 2A includes an address determining circuit 111 and a transfer transistor group 112. The address determining circuit 111 turns on a transfer transistor 112a configured to switch supply of the voltage Vera' or Vera-ΔV in the selected block, based on a block address signal Block Adrs. On the other hand, in the unselected block, a gate of a transfer transistor 112b configured to supply the power supply voltage Vdd is supplied with the voltage Vdd, whereby the select gate lines SGD2 and SGS2 are charged to a power supply voltage Vdd-Vth. Subsequently, when the bit lines BL and source line SL rise to the voltage Vera, the voltage of the select gate lines SGD2 and SGS2 rise due to capacitive coupling, thereby causing the transfer transistor 112b to be turned off. As a result, the select gate lines SGD2 and SGS2 attain the floating state.

Second Embodiment

Next, a nonvolatile semiconductor memory device in accordance with a second embodiment is described.

Figure 10:
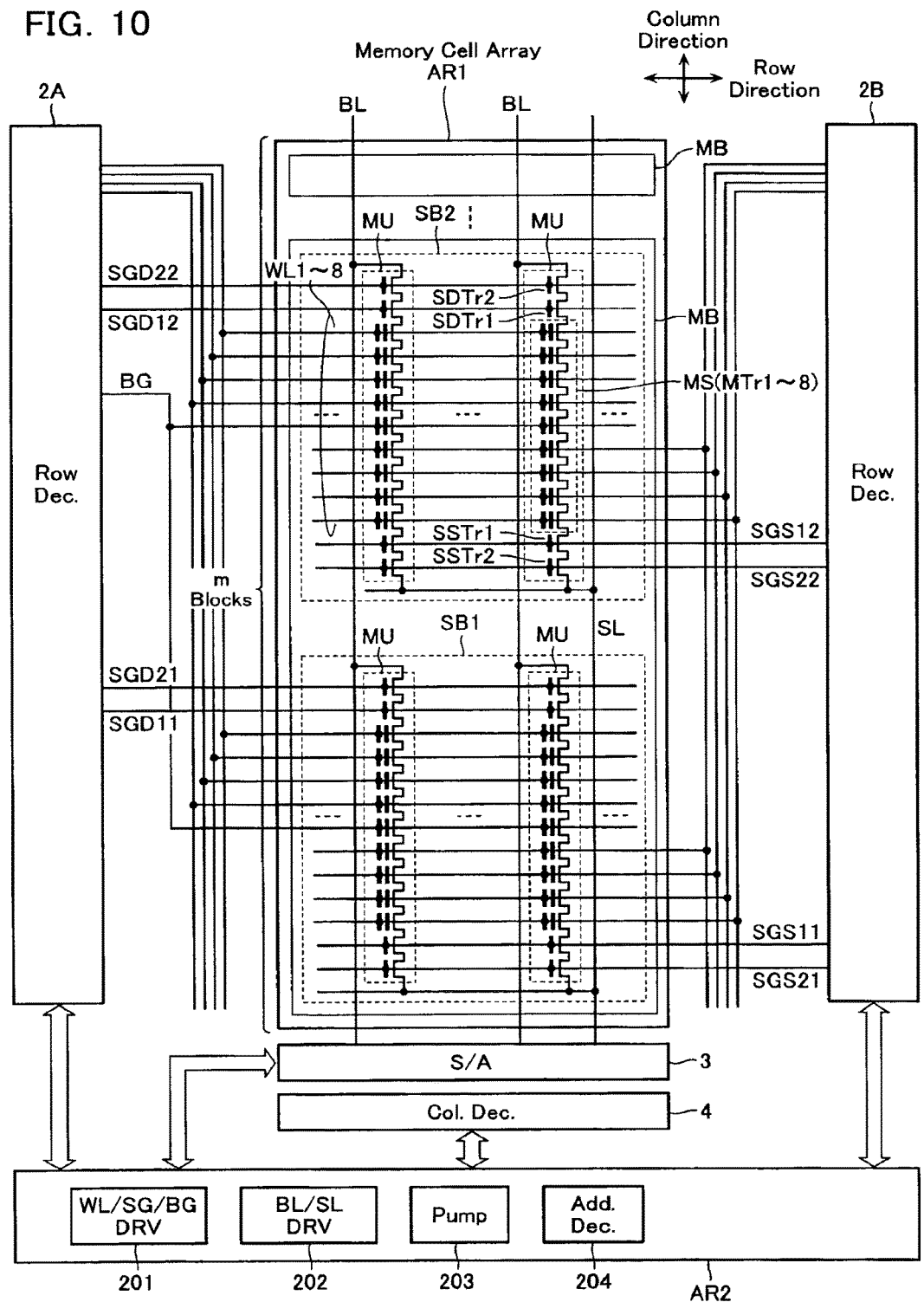
FIG. 10 is a circuit diagram of an overall configuration of a nonvolatile semiconductor memory device in accordance with a second embodiment.
Figure 11:
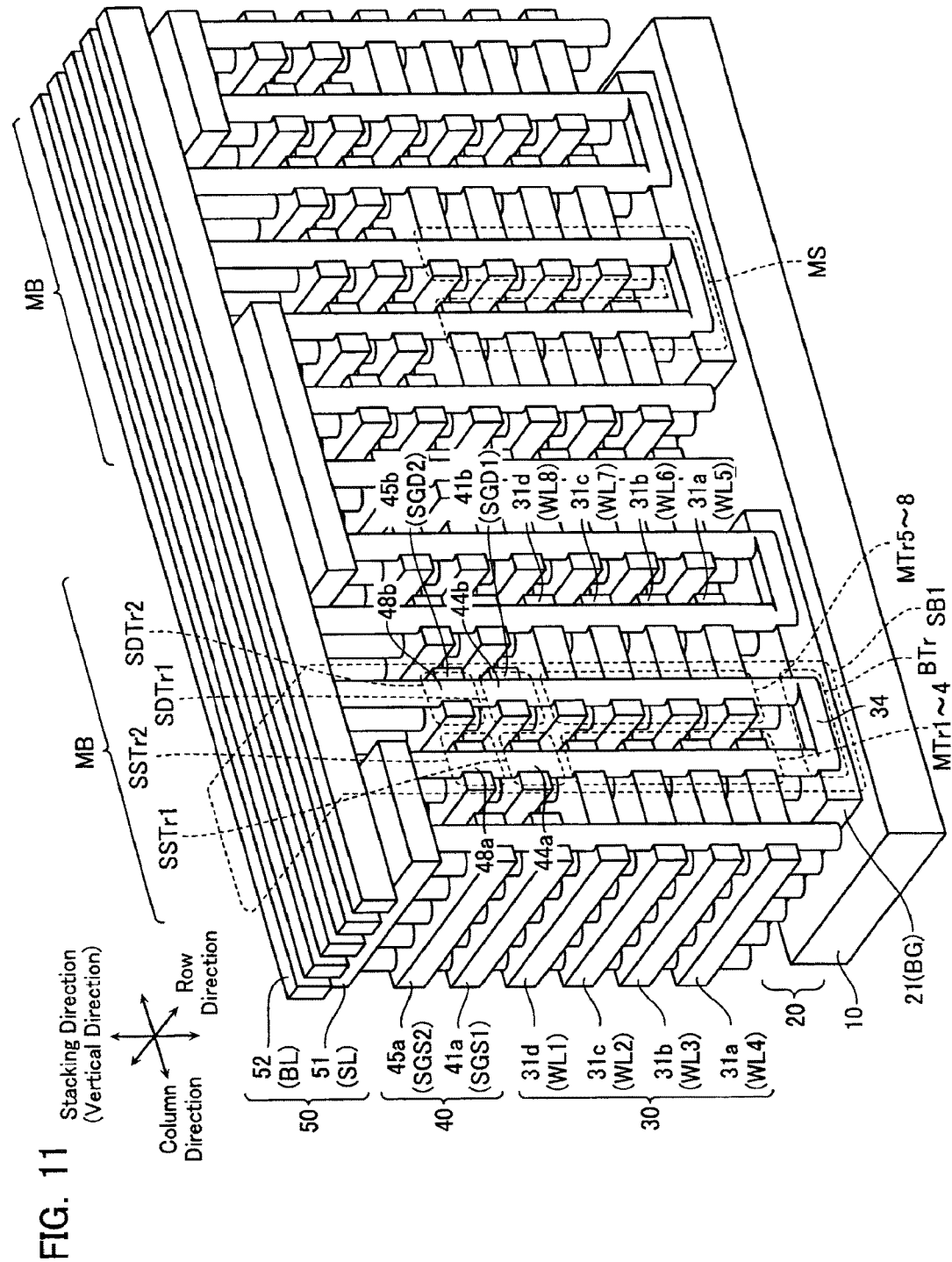
FIG. 11 is a schematic perspective view of a memory cell array AR1 in FIG. 10.

FIG. 10 is a circuit diagram of an overall configuration of the nonvolatile semiconductor memory device in accordance with the second embodiment. FIG. 11 is a schematic perspective view of a memory cell array AR1 in the nonvolatile semiconductor memory device in accordance with the second embodiment. Note that configurations similar to those in the first embodiment are assigned with identical symbols to the first embodiment and detailed descriptions thereof are omitted below.

In this embodiment, the memory unit MU, as well as comprising the select transistors SDTr2 and SSTr2 connected to the bit lines BL and source line SL, also comprises separate select transistors SDTr1 and SSTr1 connected in series to the select transistors SDTr2 and SSTr2. The select transistors SDTr1 and SSTr1 are connected between the select transistors SDTr2 and SSTr2 and the memory string MS. The reason for providing these two series-connected select transistors in this way is to prevent a GIDL current from being generated in the unselected block due to the potential difference between the select gate lines SGD2 or SGS2 and the word lines WL as previously mentioned. Hereinafter, the select transistors SDTr2 and SSTr2 are referred to as 'second drain side select transistor SDTr2' and 'second source side select transistor SSTr2'; and the select transistors SDTr1 and SSTr1 are referred to as 'first drain side select transistor SDTr1' and 'first source side select transistor SSTr2'.

Figure 12:
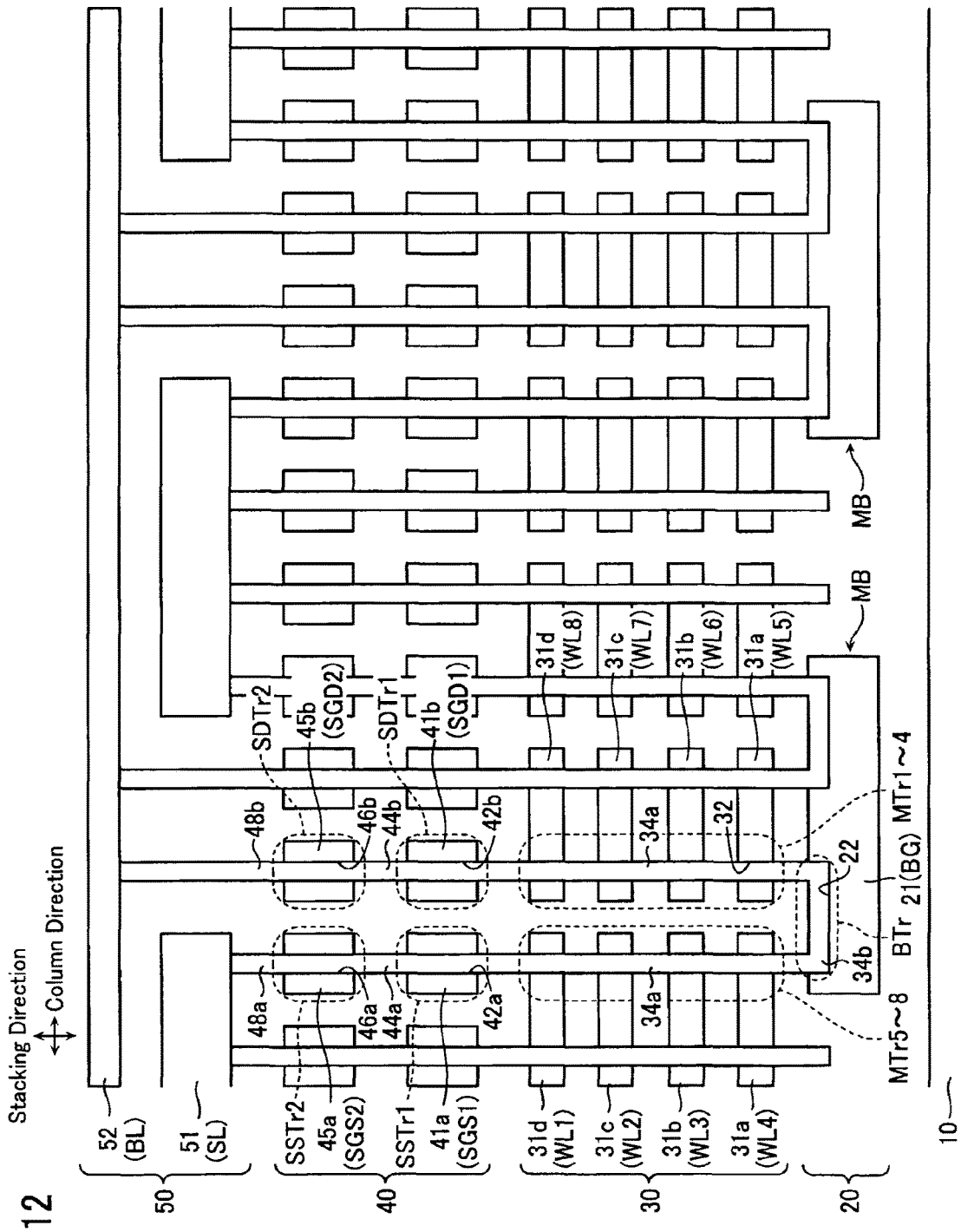
FIG. 12 is a schematic cross-sectional view of one memory block MB in the memory cell array AR1 in FIG. 10.

As shown in FIG. 12, the first source side select transistor SSTr1 and the first drain side select transistor SDTr1 include a source side conductive layer 41a and a drain side conductive layer 41b, respectively. The source side conductive layer 41a functions as a source side select gate line SGS1 of the first source side select transistor SSTr1. The drain side conductive layer 41b functions as a drain side select gate line SGD1 of the first drain side select transistor SDTr1.

Figure 13:
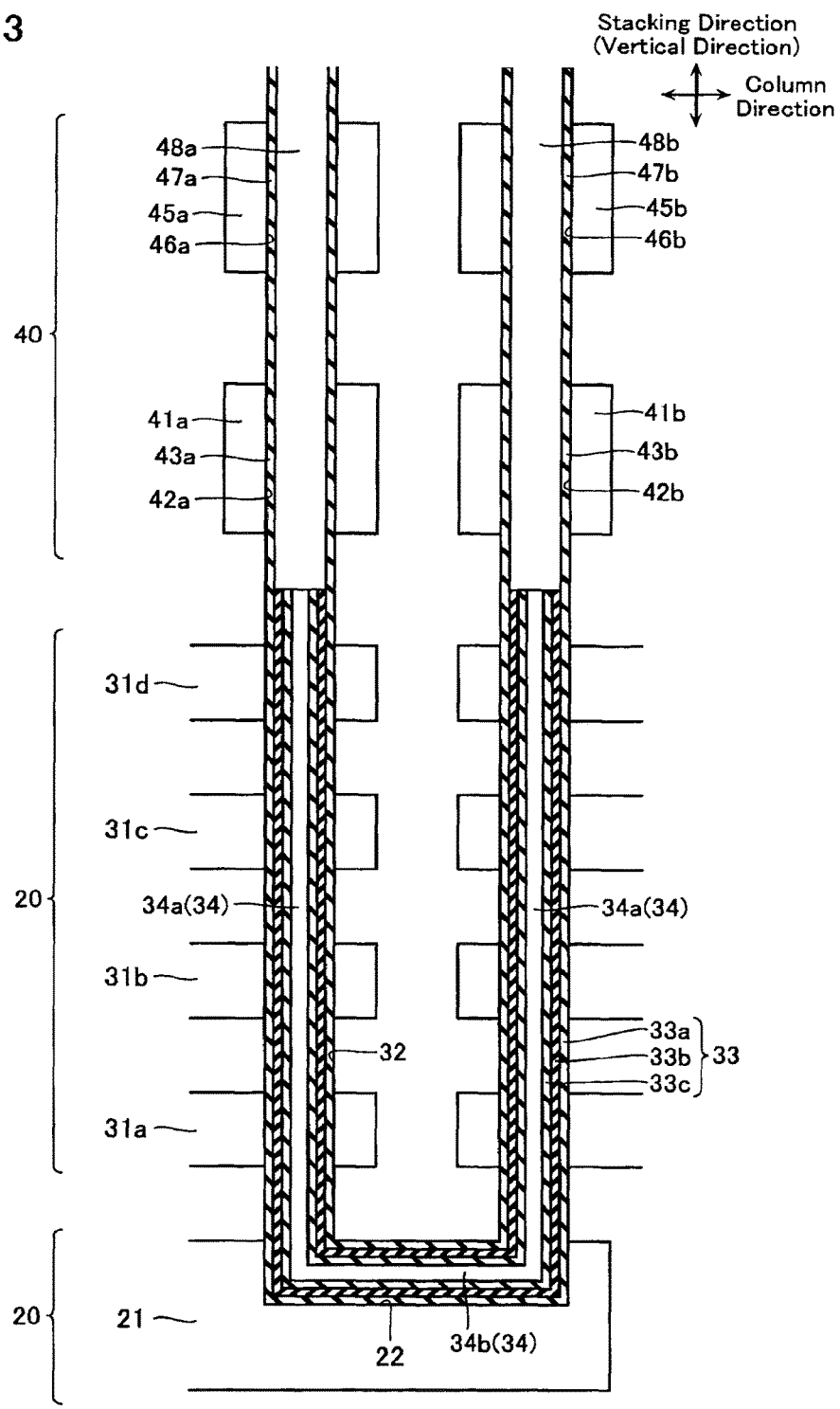
FIG. 13 is a schematic cross-sectional view of one memory unit MU in one memory block MB.

As shown in FIG. 13, the source side conductive layer 41a is formed so as to surround the semiconductor layer 48a with a gate insulating film 43a interposed therebetween, and the drain side conductive layer 41b, which is in the same layer as the source side conductive layer 41a, is formed similarly so as to surround the semiconductor layer 48b with a gate insulating film 43b interposed therebetween. The source side conductive layer 41a and the drain side conductive layer 41b are configured by polysilicon (poly-Si).

Figure 14:
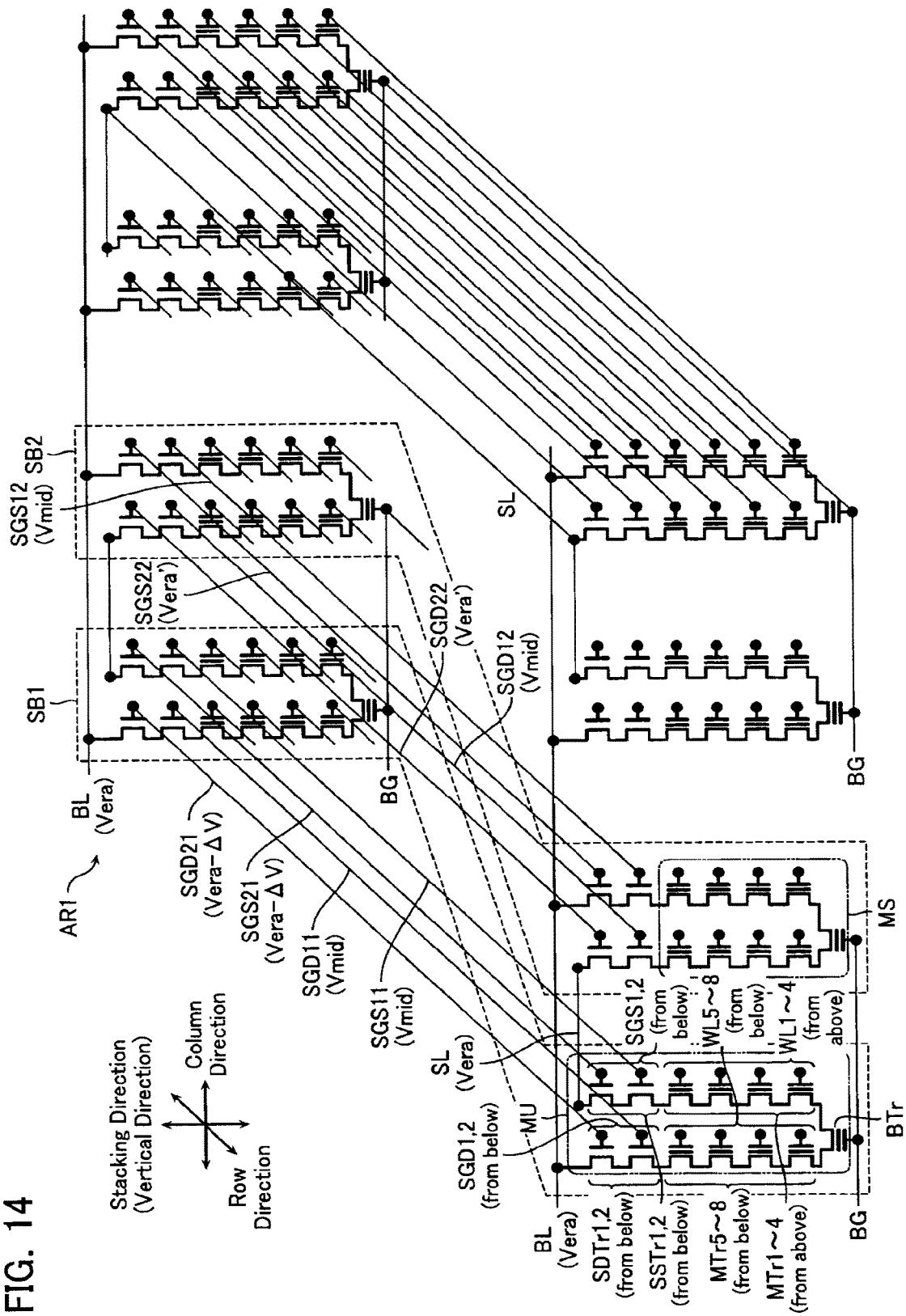
FIG. 14 shows an erase operation in the second embodiment.
Figure 15B:
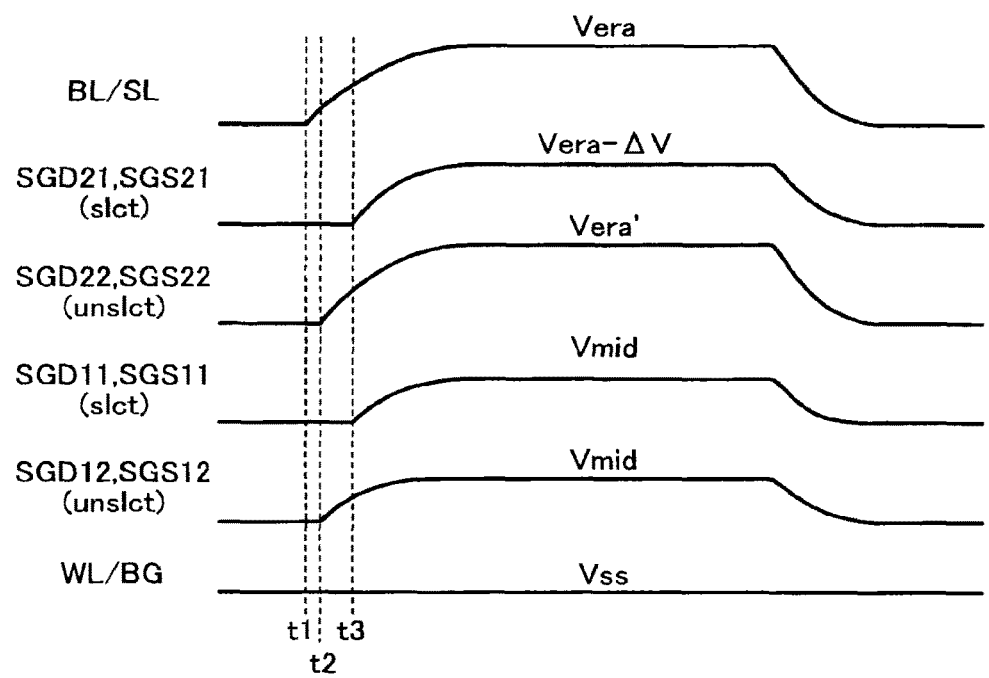
FIG. 15B shows the erase operation in the second embodiment.

Next, an erase operation in the nonvolatile semiconductor memory device in accordance with the present embodiment is described with reference to FIGS. 14, 15A, and 15B. FIGS. 14 and 15A show an equivalent circuit diagram of the memory cell array AR1 and voltages applied to each part. FIG. 15B is a timing chart showing timing of application of voltages. It is assumed here too that, of the two sub-blocks in one memory block MB, the sub-block SB1 is set as erase target, and the sub-block SB2 is set to erase prohibit. Moreover, in the description below, the select gate lines SGD2 and SGS2 in the sub-block SB1 are referred to as SGD21 and SGS21, and the select gate lines SGD1 and SGS1 in the sub-block SB1 are referred to as SGD11 and SGS11; similarly, the select gate lines SGD2 and SGS2 in the sub-block SB2 are referred to as SGD22 and SGS22, and the select gate lines SGD1 and SGS1 in the sub-block SB2 are referred to as SGD12 and SGS12.

In the sub-block SB1 selected as erase target, at time t1, the bit lines BL and source line SL are each set to the erase voltage Vera (about 20 V). Meanwhile, the word lines WL are applied with the ground voltage Vss (0 V). Then, at time t3, the second drain side select gate line SGD21 and the second source side select gate line SGS21 are each applied with the voltage Vera-ΔV which is lower than the voltage Vera by about a voltage ΔV (for example, 5-8 V). This causes a GIDL (Gate Induced Drain Leakage) current to be generated at an end of the drain side select transistor SDTr2 on the bit line BL side and an end of the source side select transistor SSTr2 on the source line SL side in the sub-block SB1 (refer to FIG. 15A), whereby the voltage Vera applied to the bit lines BL and source line SL is transferred to the body of the memory units MU in the sub-block SB1. This causes the erase operation in the sub-block SB1 to be executed as a result of the potential difference between the voltage Vera of the body and the voltage Vss of the word lines WL. Meanwhile, at time t3, the drain side select gate line SGD11 and the source side select gate line SGS11 are applied with a voltage Vmid having a magnitude substantially intermediate between the erase voltage Vera' and the ground voltage Vss (for example, about 10 V).

In the unselected erase-prohibited sub-block SB2, at time t2, the drain side select gate line SGD22 and the source side select gate line SGS22 are applied with the voltage Vera' substantially identical to the erase voltage Vera, whereby generation of a GIDL current is prevented. In addition, at time t2, the drain side select gate line SGD12 and the source side select gate line SGS12 are applied with the voltage Vmid having a magnitude substantially intermediate between the erase voltage Vera' and the ground voltage Vss (for example, about 10 V). As a result, the difference in voltage applied between the plurality of lines disposed adjacent to each other with a small wiring space is reduced. Hence, the risk of a GIDL current being generated can be reduced. That is, the risk of a false erase occurring in the unselected sub-block SB2 can be reduced.

Figure 16B:
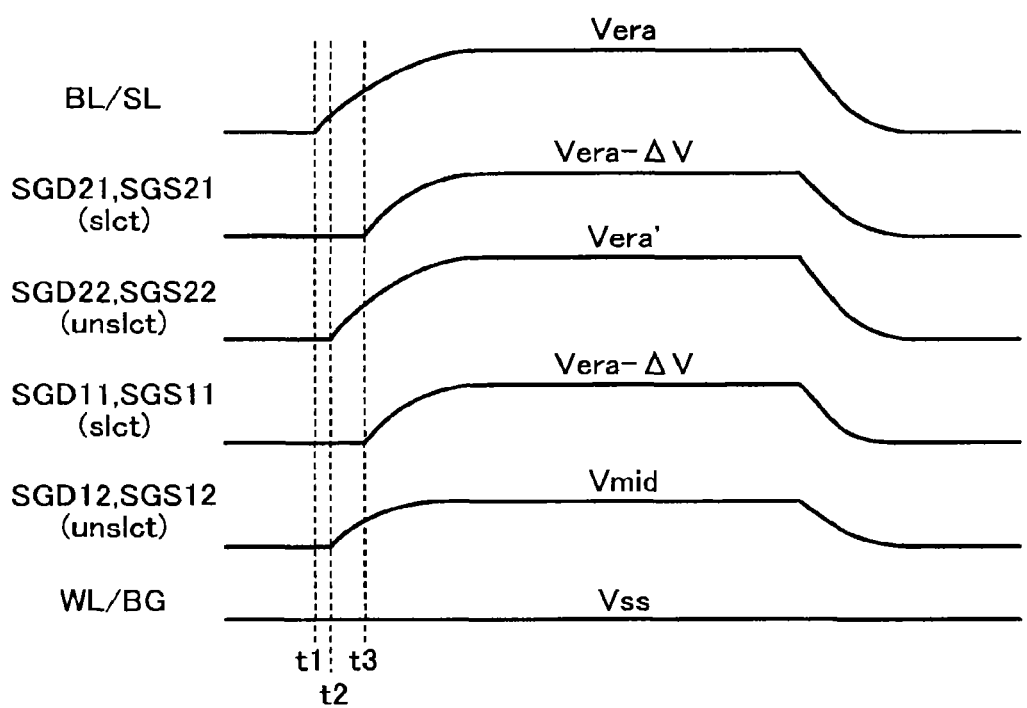
FIG. 16B shows the erase operation in the modified example in the second embodiment.

Note that, as shown in FIGS. 16A and 16B, the voltage applied to the select gate lines SGD11 and SGS11 may be set to the voltage Vera-ΔV similarly to the select gate lines SGD21 and SGS21.

Figure 17A:
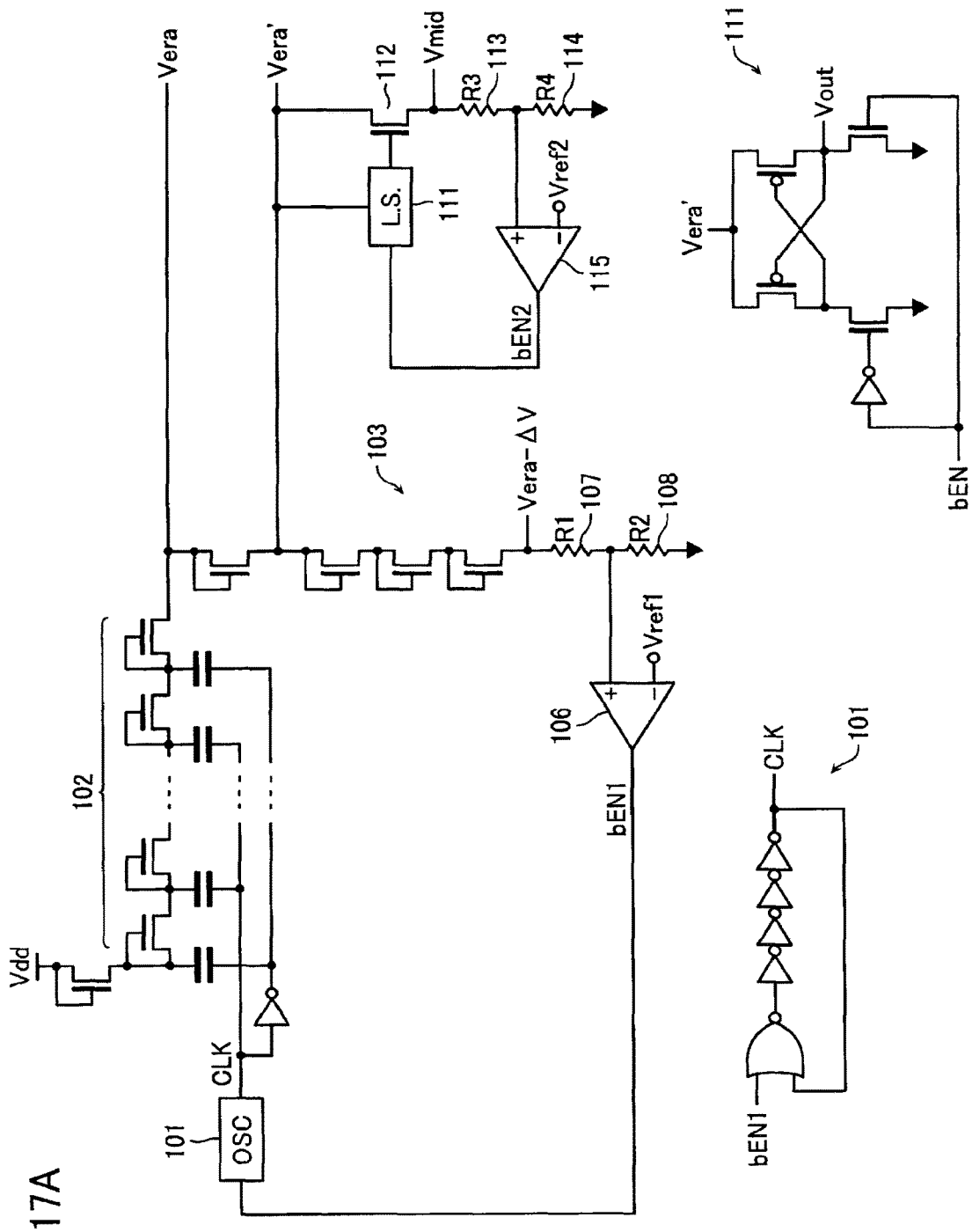
FIG. 17A is one example of a charge pump circuit and a voltage value adjusting circuit optimal for generating various voltages in the second embodiment.

FIG. 17A is one example of a circuit for generating the above-mentioned voltage Vmid. The circuit in FIG. 17A differs from that in FIG. 9A in comprising a level shifter 111, an NMOS transistor 112, splitting resistances 113 and 114, and a differential amplifier 115, for generating the voltage Vmid. The NMOS transistor 112 has its drain applied with the voltage Vera' and its source connected to one end of the splitting resistances 113 and 114. A voltage generated at the source is the voltage Vmid. The other end of the splitting resistances 113 and 114 is grounded, and a connection node of the splitting resistances 113 and 114 is connected to one input terminal of the differential amplifier 115. An output terminal of the differential amplifier 115 is connected to the level shifter 111, and an output terminal of the level shifter 111 is connected to a gate of the NMOS transistor 112.

This circuit configuration causes the voltage Vmid generated at the source of the NMOS transistor 112 to rise with substantially the same timing as the voltage Vera'. In addition, determination of whether this voltage Vmid has reached a desired voltage is performed by the splitting resistances 113 and 114 and the differential amplifier 115. When the voltage Vmid reaches the desired voltage, an output signal bEN2 of the differential amplifier 115 switches to "H". This causes an output signal Vout of the level shifter 111 to become "L", whereby the NMOS transistor 112 is switched off (OFF). Conversely, when the voltage Vmid falls below the desired voltage, the output signal Vout of the level shifter 111 becomes "H", whereby the NMOS transistor 112 is turned on (ON). Repetition of such an operation causes the voltage Vmid to be maintained at a constant value.

Figure 17B:
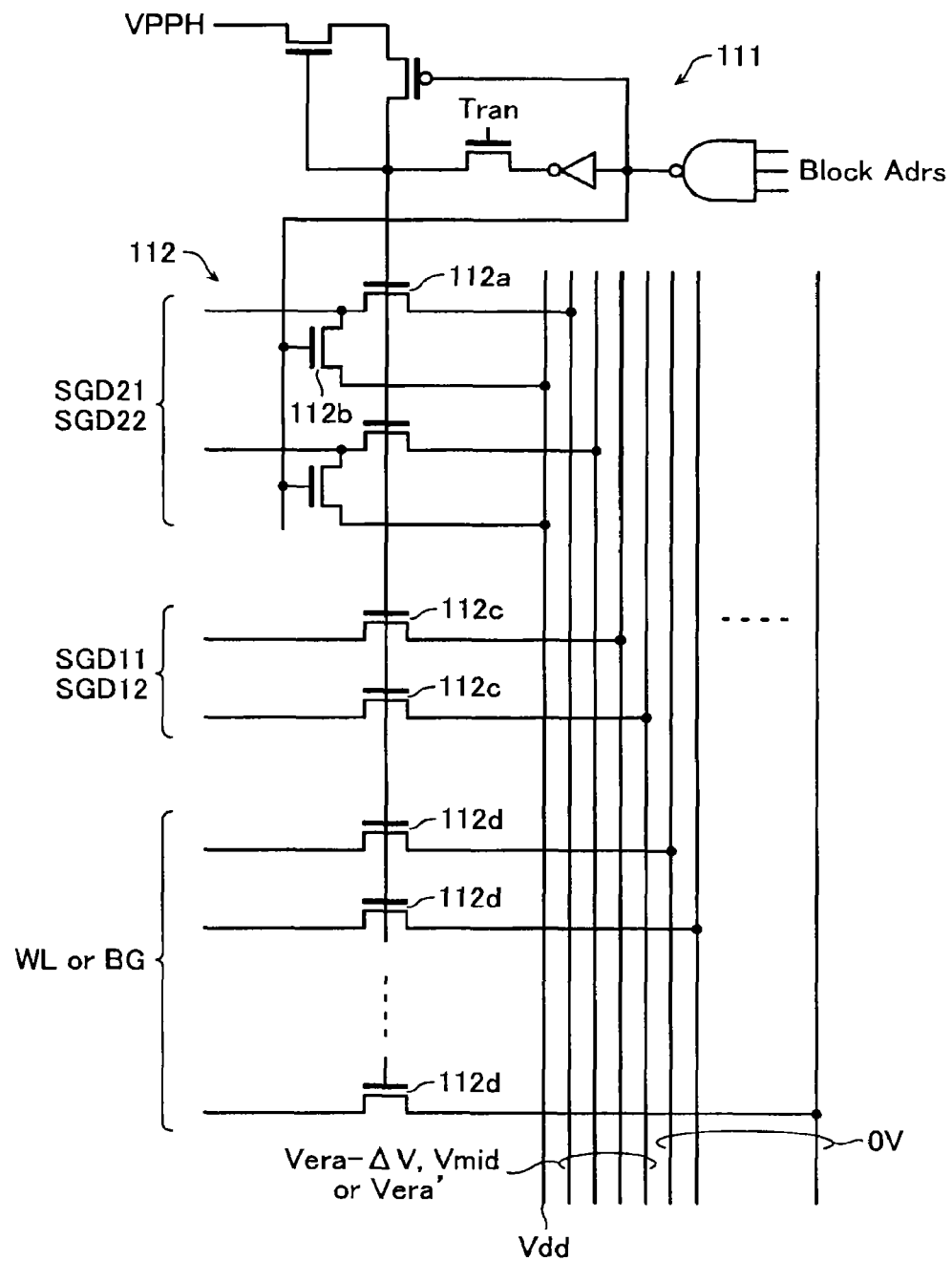
FIG. 17B is one example of a row decoder 2A employed in the second embodiment.

One example of the row decoder 2A utilized in the present embodiment is shown in FIG. 17B. FIG. 17B differs from FIG. 9B in that, in FIG. 17B, transfer transistors 112c are provided for supplying the voltage Vmid to the select gate lines SGD11 and SGD12. There is no need to control select/unselect of the memory string MS in the case of the select gate lines SGD11 and SGD12, hence there is no need to provide the select gate lines SGD11 and SGD12 with pull down transistors corresponding to the transfer transistors 112b that become necessary during unselect.

Third Embodiment

Next, a nonvolatile semiconductor memory device in accordance with a third embodiment is described.

Figure 18A:
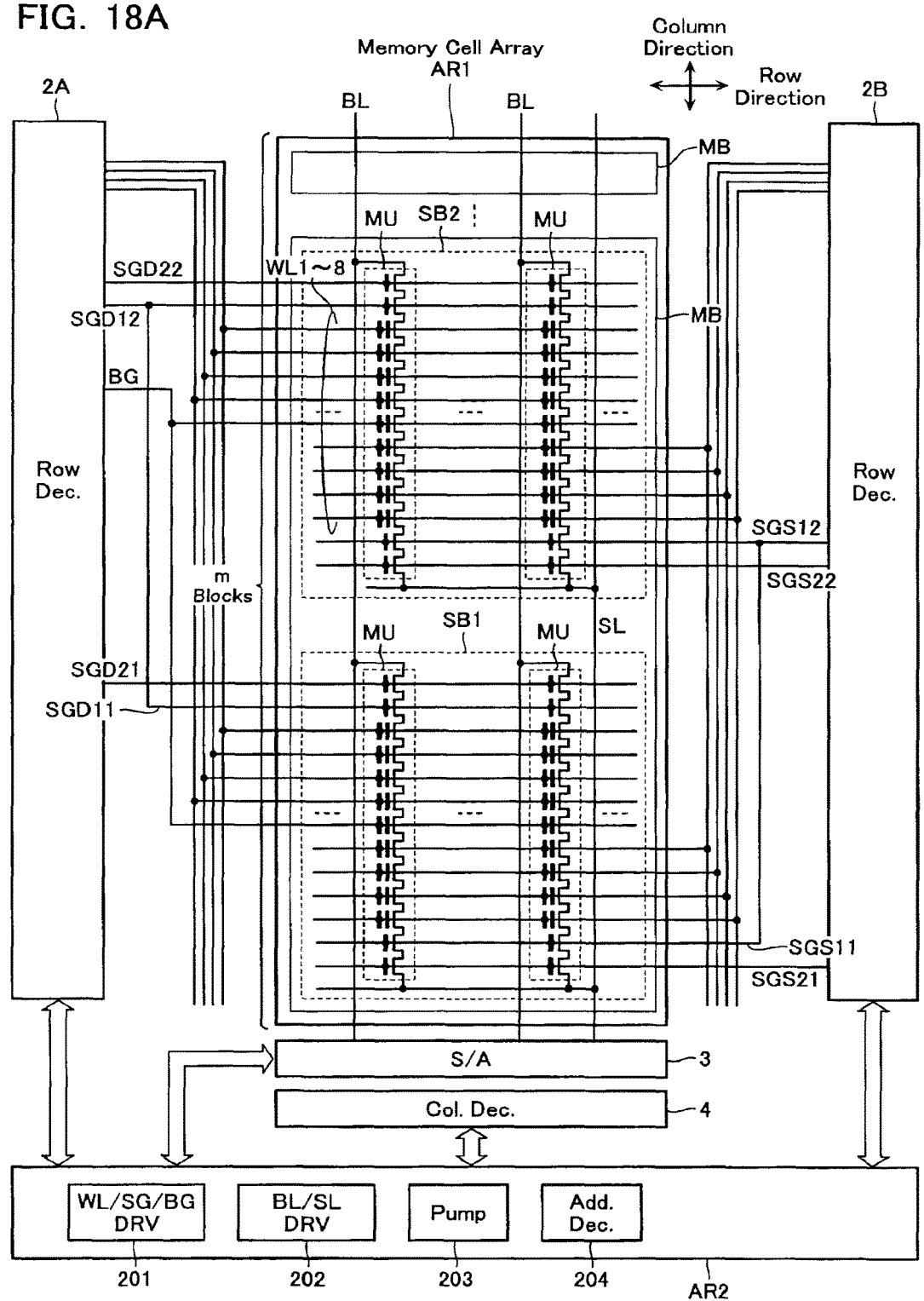
FIG. 18A is a circuit diagram of an overall configuration of a nonvolatile semiconductor memory device in accordance with a third embodiment.

FIG. 18A is a circuit diagram of an overall configuration of the nonvolatile semiconductor memory device in accordance with the third embodiment. In this third embodiment, similarly to in the second embodiment, the memory unit MU, as well as comprising the second select transistors SDTr2 and SSTr2, also comprises the separate select transistors SDTr1 and SDTr1. However, in this third embodiment, contrary to in the second embodiment, the first drain side select gate line SGD1 and the first source side select gate line SGS1 in each block are each commonly connected between a plurality of sub-blocks. Other configurations and various operations are substantially similar to those in the above-described embodiments. An erase operation similar to those in the above-described separate embodiments can be performed by applying voltages of the kind shown in FIGS. 15A and 15B.

Figure 18B:
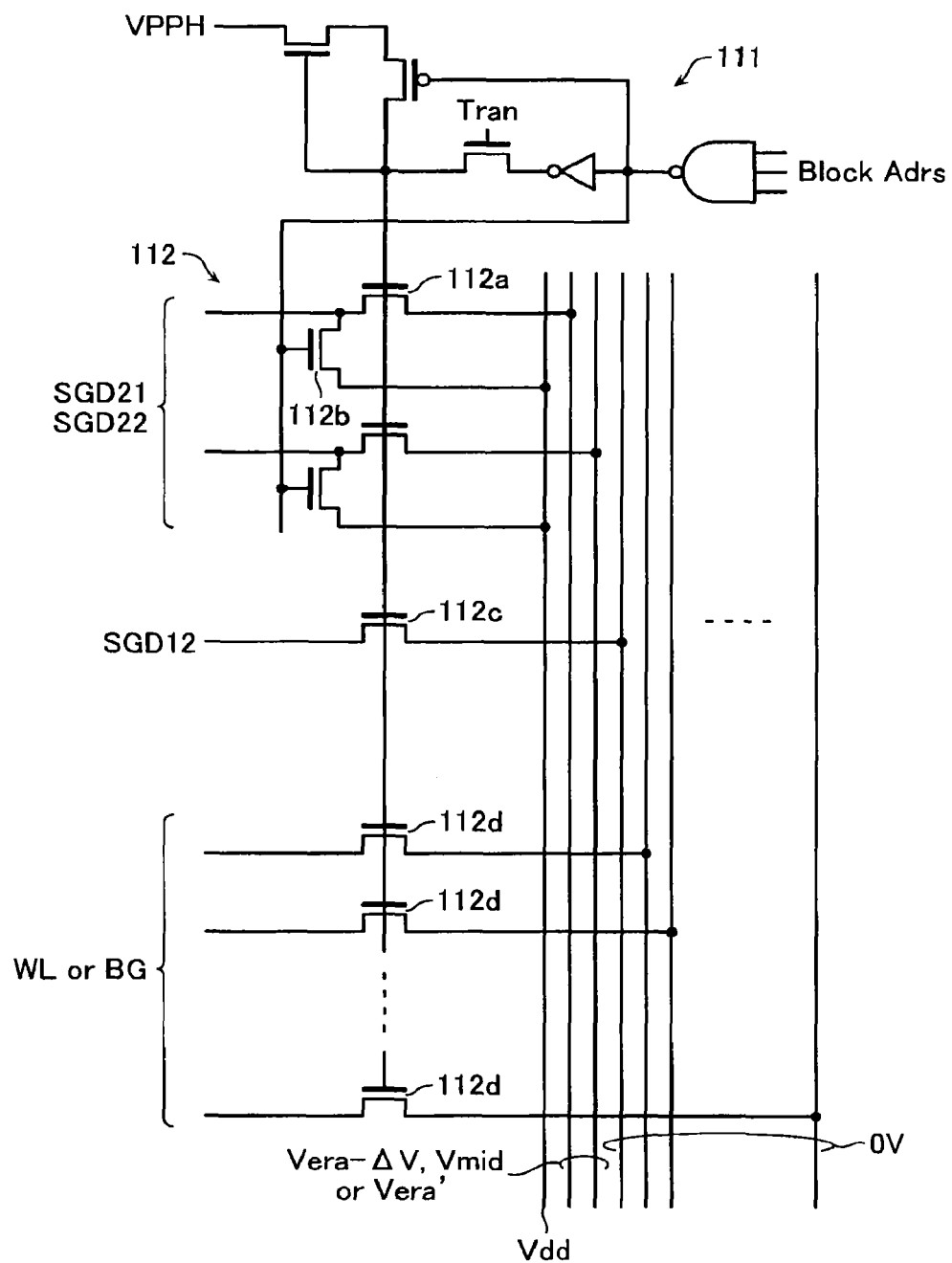
FIG. 18B is one example of a row decoder 2A employed in the third embodiment.

FIG. 18B shows one example of the row decoder 2A utilized in the present embodiment. FIG. 18B differs from FIG. 17B in that, in FIG. 18B, only one transfer transistor 112c is provided for supplying the voltage Vmid to the select gate lines SGD11 and SGD12.

Fourth Embodiment

Next, a nonvolatile semiconductor memory device in accordance with a fourth embodiment is described.

Figure 19A:
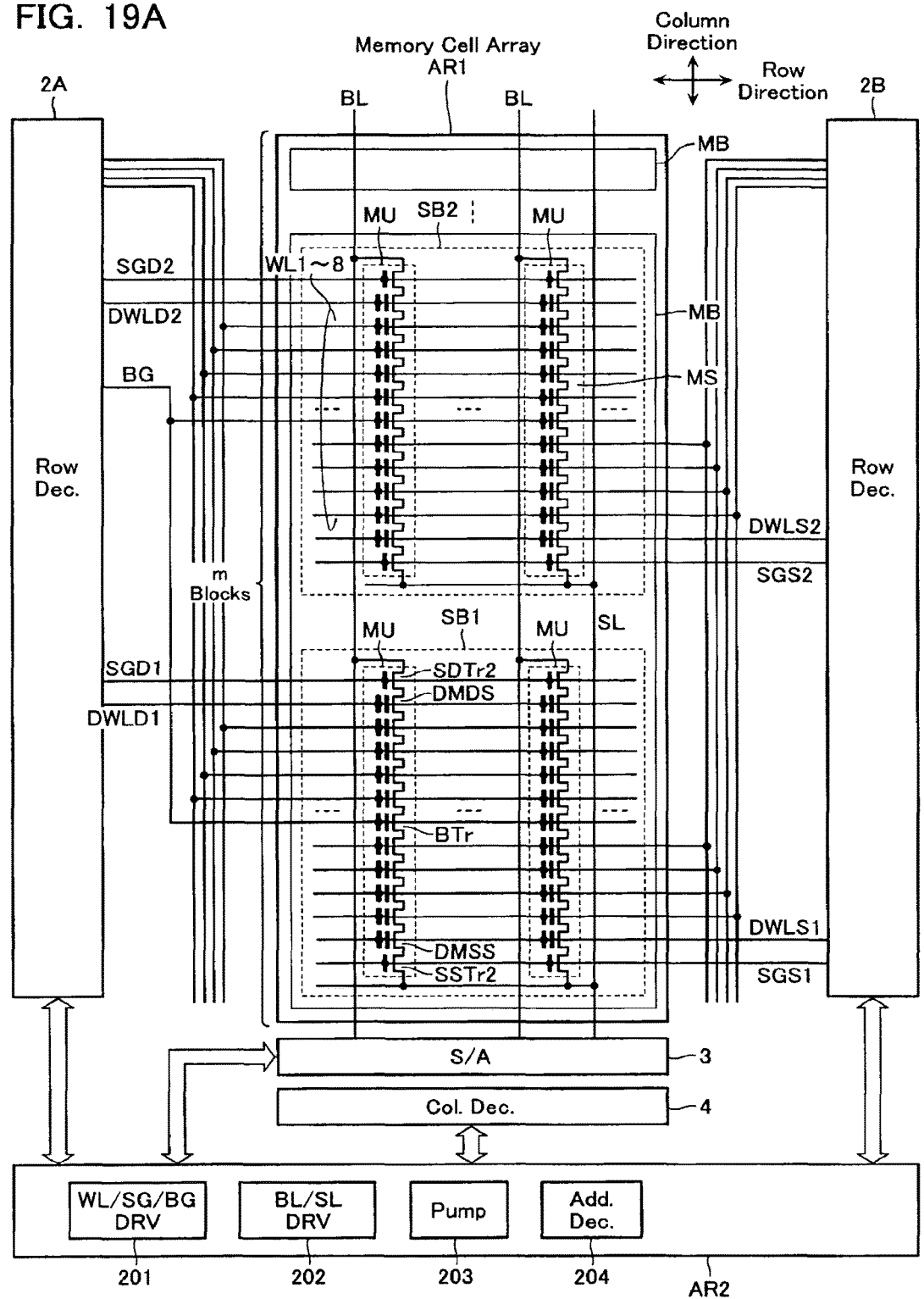
FIG. 19A is a circuit diagram of an overall configuration of a nonvolatile semiconductor memory device in accordance with a fourth embodiment.
Figure 19B:
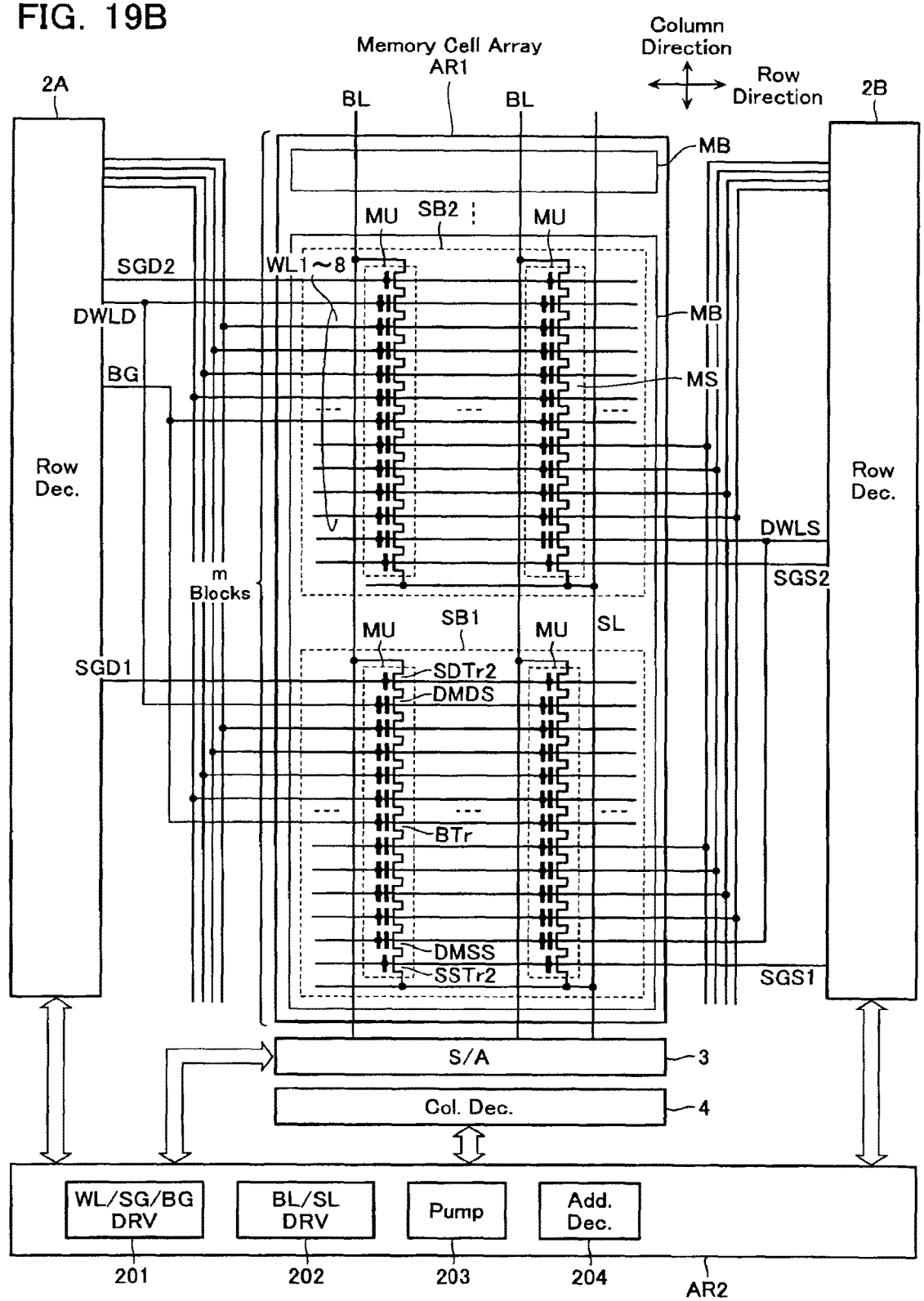
FIG. 19B is a circuit diagram of an overall configuration of a modified example of the nonvolatile semiconductor memory device in accordance with the fourth embodiment.
Figure 20:
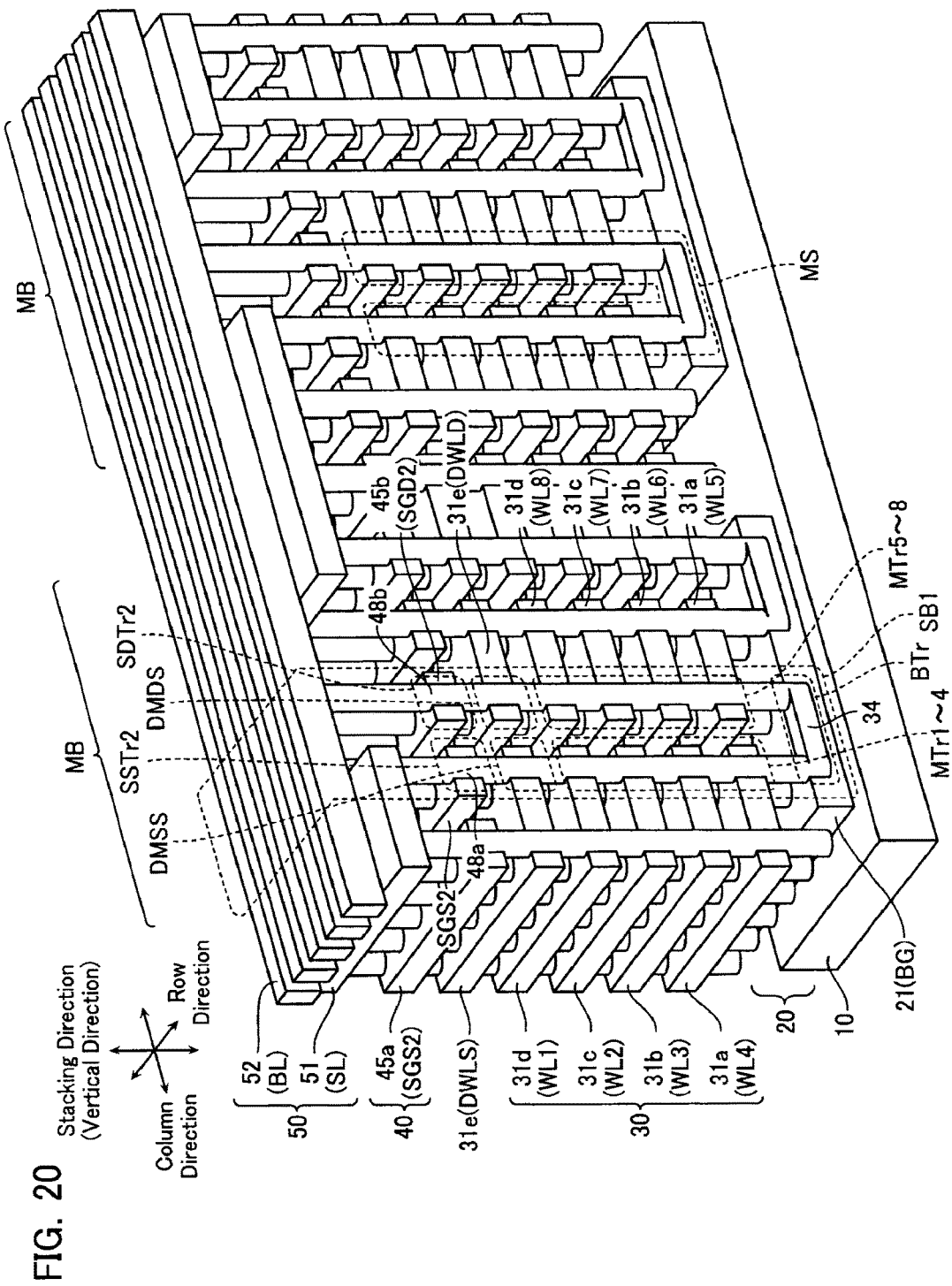
FIG. 20 is a schematic perspective view of a memory cell array AR1 in FIG. 19.

FIG. 19A is a circuit diagram of an overall configuration of the nonvolatile semiconductor memory device in accordance with the fourth embodiment, and FIG. 19B is a modified example. In addition, FIG. 20 is a schematic perspective view of the memory cell array AR1. This fourth embodiment has one drain side select transistor SDTr and one source side select transistor SSTr for one memory unit MU, similarly to the first embodiment. However, this fourth embodiment differs from the first embodiment in having dummy memory transistors DMSS and DMDS provided between the drain side select transistor SDTr or source side select transistor SSTr and the memory transistors MTr. The dummy transistors DMSS and DMDS configure part of the memory string MS and have a structure similar to that of ordinary memory transistors MTr, but are not employed for data storage and have their threshold voltage maintained at a constant value (for example, constantly at an erase level).

Figure 21:
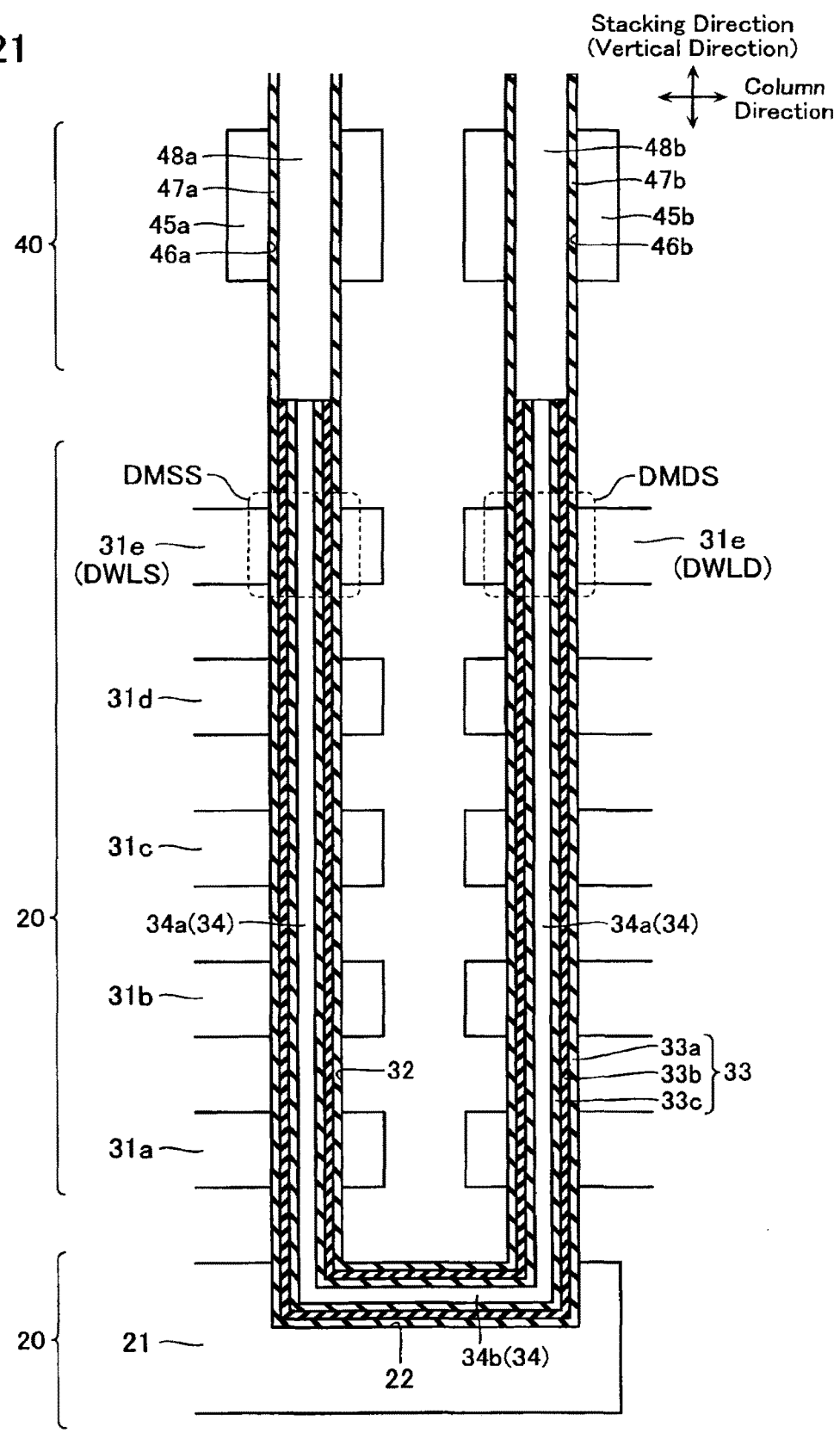
FIG. 21 is a schematic cross-sectional view of one memory block MB in the memory cell array AR1 in FIG. 19.

As shown in FIG. 21, the dummy transistor DMSS comprises: the memory gate insulating layer 33 formed so as to surround the columnar portion 34a of the memory semiconductor layer 34 similar to in the memory transistors MTr; and a dummy word line conductive layer 31e provided so as to surround the columnar portion 34a sandwiching the memory gate insulating layer 33 therebetween. The dummy word line conductive layer 31e is formed from polysilicon, for example, and functions as a dummy word line DWLS.

Similarly, the dummy transistor DMDS comprises: the memory gate insulating layer 33 formed so as to surround the columnar portion 34a of the memory semiconductor layer 34; and a dummy word line conductive layer 31e provided so as to surround the columnar portion 34a sandwiching the memory gate insulating layer 33 therebetween. The dummy word line conductive layer 31e functions as a dummy word line DWLD.

An erase operation in this fourth embodiment can be executed in a substantially similar manner to that in the second embodiment. That is, the erase operation can be executed in a sub-block unit by applying the voltage applied to the first drain side select gate line SGD1 and first source side select gate line SGS1 in the second embodiment, as is, to the dummy word lines DWLD and DWLS, and setting applied voltages to the other lines similarly to in the second embodiment.

That is, in the case of the configuration in FIG. 19A, it is only required to apply voltages of the kind shown in FIGS. 15A and 16A to each part. In the case of a configuration in which the dummy word lines DWLD and DWLS are commonly connected between a plurality of sub-blocks SB as in the configuration in FIG. 19B, it is only required to apply voltages of the kind shown in FIG. 16A to each part.

Fifth Embodiment

Next, a nonvolatile semiconductor memory device in accordance with a fifth embodiment is described.

Figure 22A:
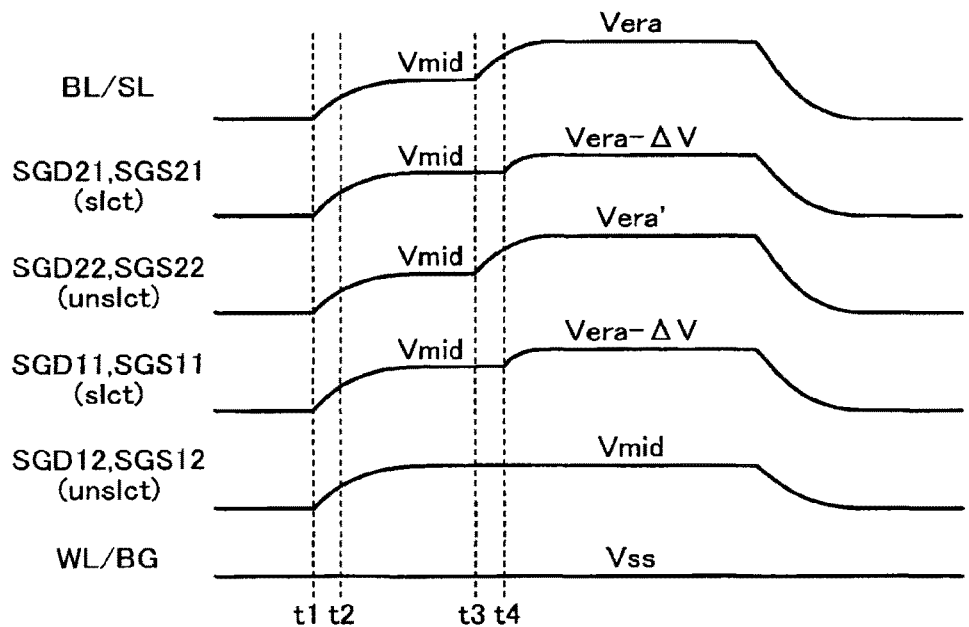
FIG. 22A shows an operation in a nonvolatile semiconductor memory device in accordance with a fifth embodiment.

Configuration of the device is substantially similar to that in the second embodiment, and description thereof is thus omitted. However, as shown in FIG. 22A, this embodiment differs from the second embodiment in that, in this embodiment, for example, voltages of each part, prior to being raised to the voltages Vera, Vera-ΔV, and so on, are first raised to the voltage Vmid, and then raised to the target voltages Vera and Vera-ΔV.

Figure 22B:
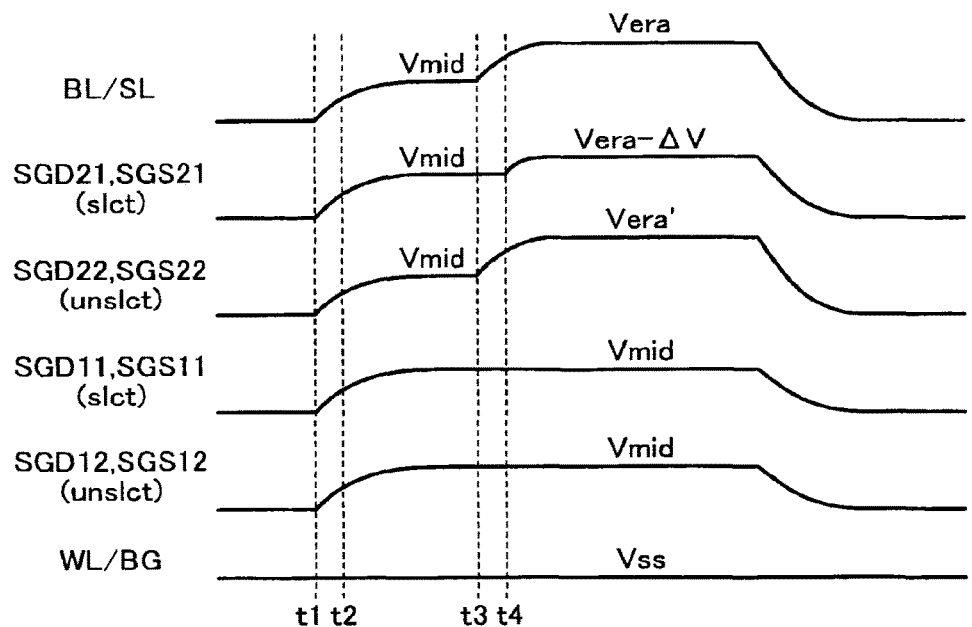
FIG. 22B shows an operation in a modified example of the nonvolatile semiconductor memory device in accordance with the fifth embodiment.

Note that, as shown in FIG. 22B, the voltages applied finally to the select gate lines SGD11 and SGS11 may be set to the voltage Vmid in place of the voltage Vera-ΔV.

FIG. 23 is one example of a charge pump circuit utilizable in this embodiment. In this embodiment, timing of generation of the voltage Vmid is arbitrary, hence, as shown in FIG. 23, the voltage Vmid can be generated using an independent oscillator 101' and charge pump circuit 102'.

Sixth Embodiment

Figure 24:
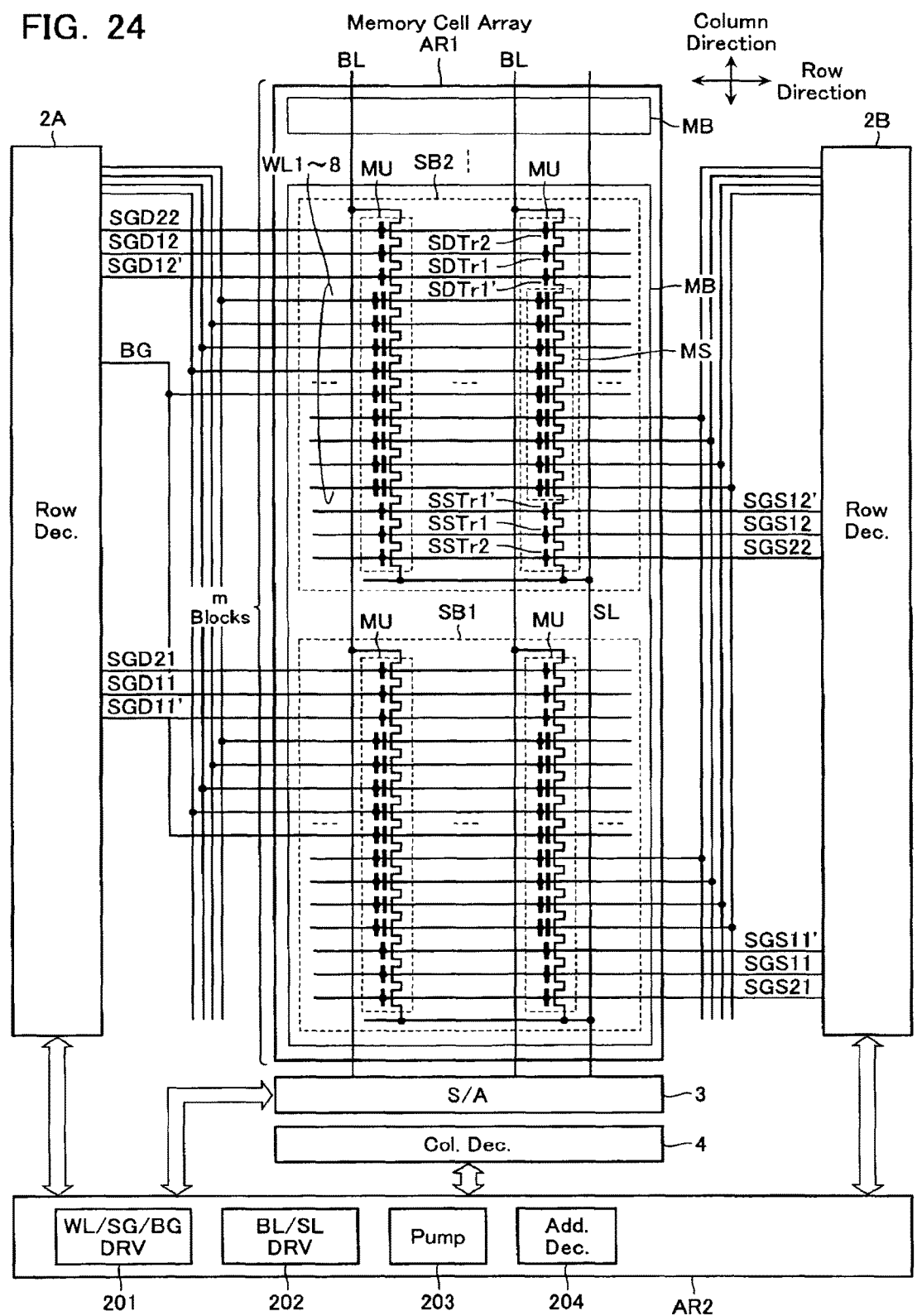
FIG. 24 is a circuit diagram of an overall configuration of a nonvolatile semiconductor memory device in accordance with a sixth embodiment.
Figure 25:
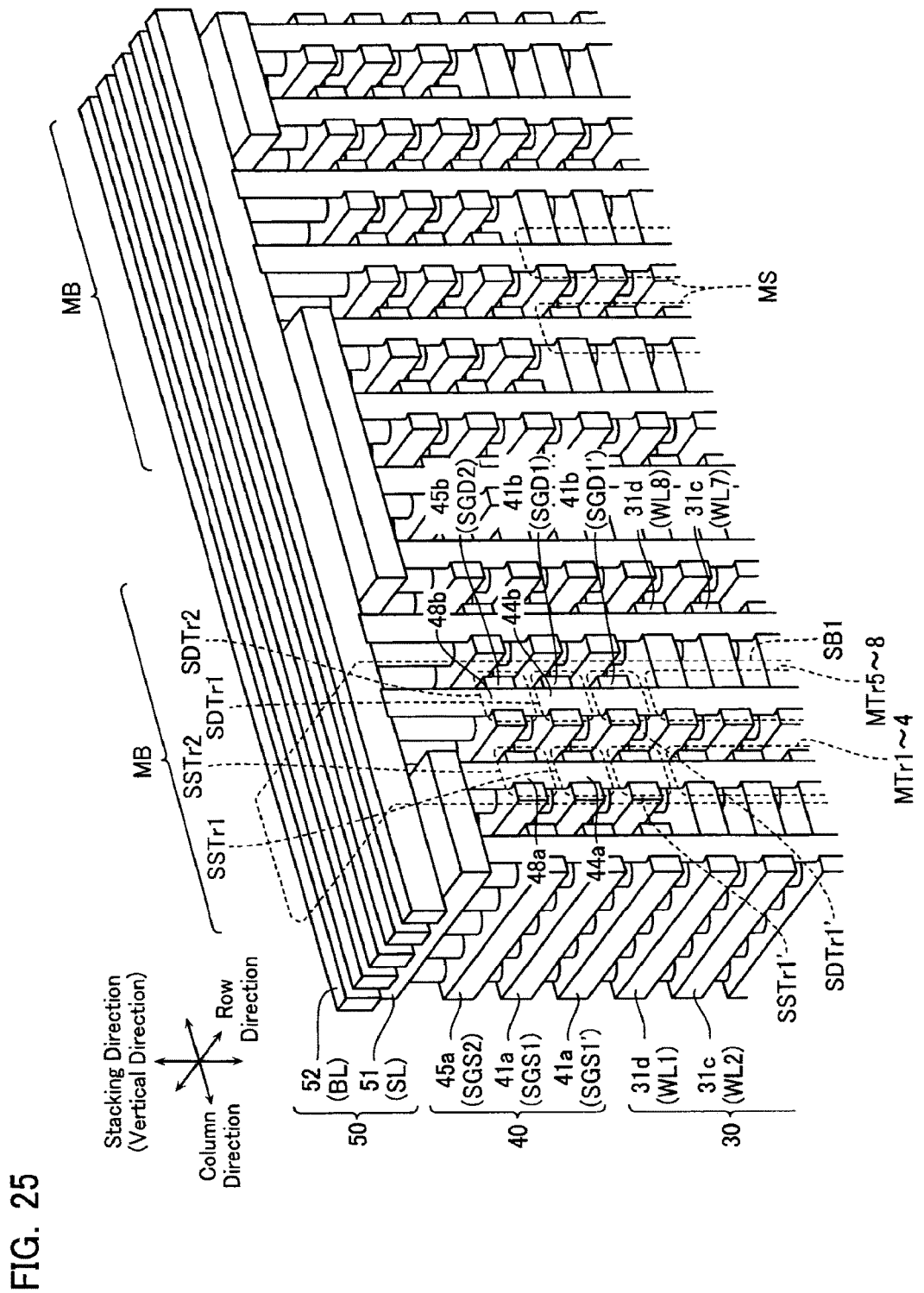
FIG. 25 is a schematic perspective view of a memory cell array AR1 in FIG. 24.
Figure 26:
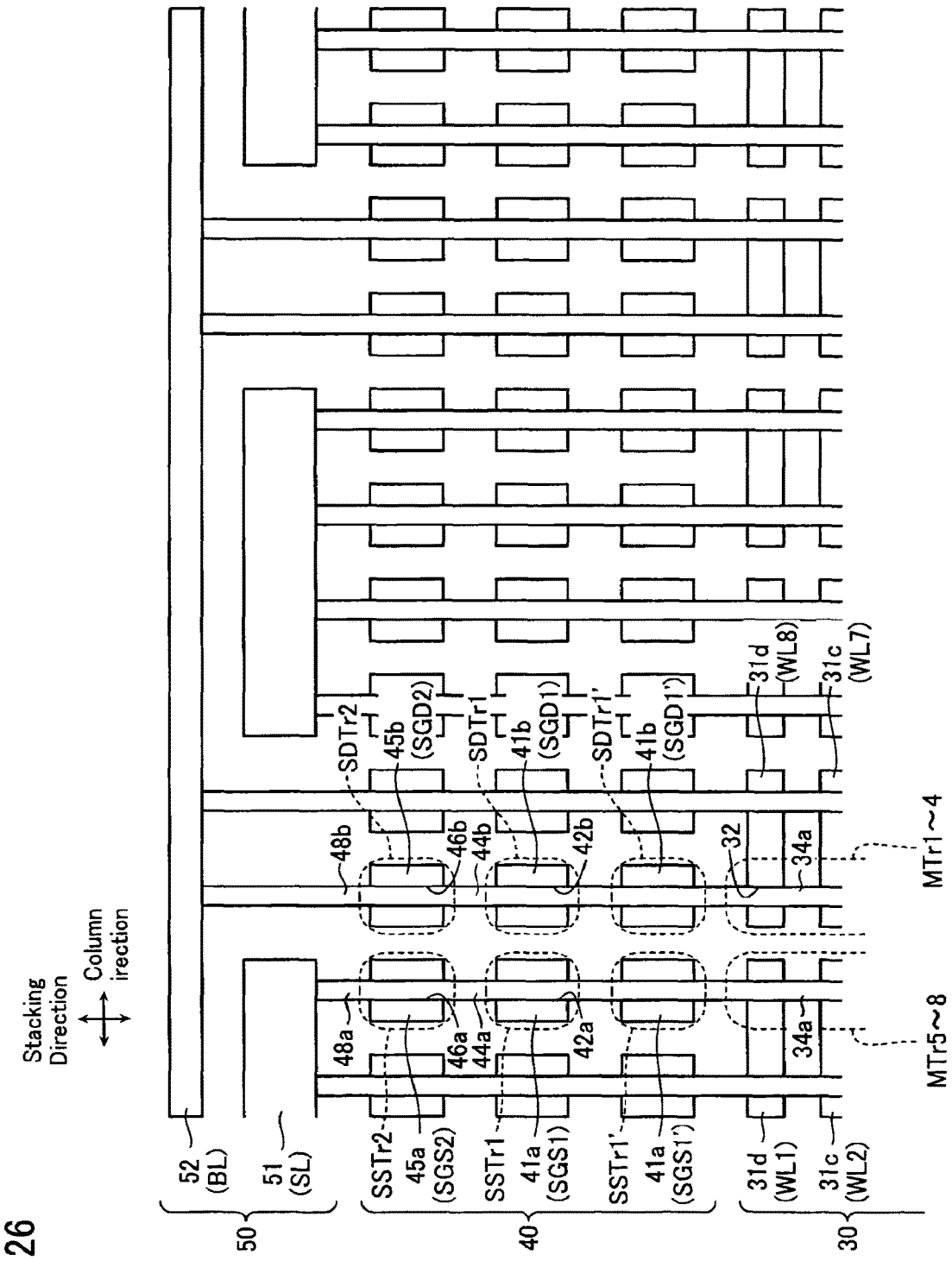
FIG. 26 is a schematic cross-sectional view of a memory block MB in the memory cell array AR1 in FIG. 24.

Next, a nonvolatile semiconductor memory device in accordance with a sixth embodiment is described with reference to FIGS. 24-26. FIG. 24 is a circuit diagram of an overall configuration of the nonvolatile semiconductor memory device in accordance with the sixth embodiment. FIGS. 25 and 26 are, respectively, a schematic perspective view and a cross-sectional view of a memory cell array AR1 in the nonvolatile semiconductor memory device in accordance with the sixth embodiment. Note that configurations similar to those in the first and second embodiments are assigned with identical symbols to the first and second embodiments and detailed descriptions thereof are omitted below. Moreover, although a structure of the memory cell array is shown in FIGS. 25 and 26 with a portion omitted, the structure of the memory cell array is similar to that in the aforementioned embodiments.

This embodiment, as well as comprising the second drain side select transistor SDTr2 and the second source side select transistor SSTr2, also comprises a plurality (for example, two) of first drain side select transistors SDTr1 and SDTr1', and a plurality (for example, two) of first source side select transistors SSTr1 and SSTr1', connected in series to the second drain side select transistor SDTr2 and second source side select transistor SSTr2, respectively. The select transistors SDTr1 and SDTr1' are connected in series between the select transistor SDTr2 and the memory string MS. The select transistors SSTr1 and SSTr1' are connected in series between the select transistor SSTr2 and the memory string MS. Configurations of other portions are substantially identical to configurations in the second embodiment (FIGS. 11, 12, and 13), and repetitive descriptions are thus omitted.

Next, an erase operation in the nonvolatile semiconductor memory device in accordance with the sixth embodiment is described with reference to FIGS. 27 and 28. Similarly to the description in the second embodiment, the case is described here where, of the two sub-blocks in one memory block MB, the sub-block SB1 is set as erase target, and the sub-block SB2 is set to erase prohibit. The select gate lines SGD2 and SGS2 in the sub-block SB1 are referred to as SGD21 and SGS21, and the select gate lines SGD1, SGS1, SGD1', and SGS1' in the sub-block SB1 are referred to as SGD11, SGS11, SGD11', and SGS11', respectively. Similarly, the select gate lines SGD2 and SGS2 in the sub-block SB2 are referred to as SGD22 and SGS22, and the select gate lines SGD1, SGS1, SGD1', and SGS1' in the sub-block SB2 are referred to as SGD12, SGS12, SGD12', and SGS12', respectively.

Voltages applied finally to each part for the erase operation are substantially similar to those in the second embodiment. However, in this embodiment, similarly to in the fifth embodiment, for example, voltages of each part, prior to being raised to the voltages Vera, Vera-ΔV, and Vera', are first raised to an intermediate voltage Vmid1 having a size substantially intermediate between the erase voltage Vera' and the ground voltage Vss, and then raised to the target voltages Vera, Vera-ΔV, and Vera'. Note that, similarly to in the second embodiment, raising to the intermediate voltage Vmid1 may be omitted and control performed such that the voltages are raised directly from the ground voltage to the target voltages Vera, Vera-ΔV, and Vera'.

One memory string MS in this embodiment includes two first drain side select transistors SGD1 and SGD1' connected in series, and two first source side select transistors SGS1 and SGS1' connected in series.

Figure 28:
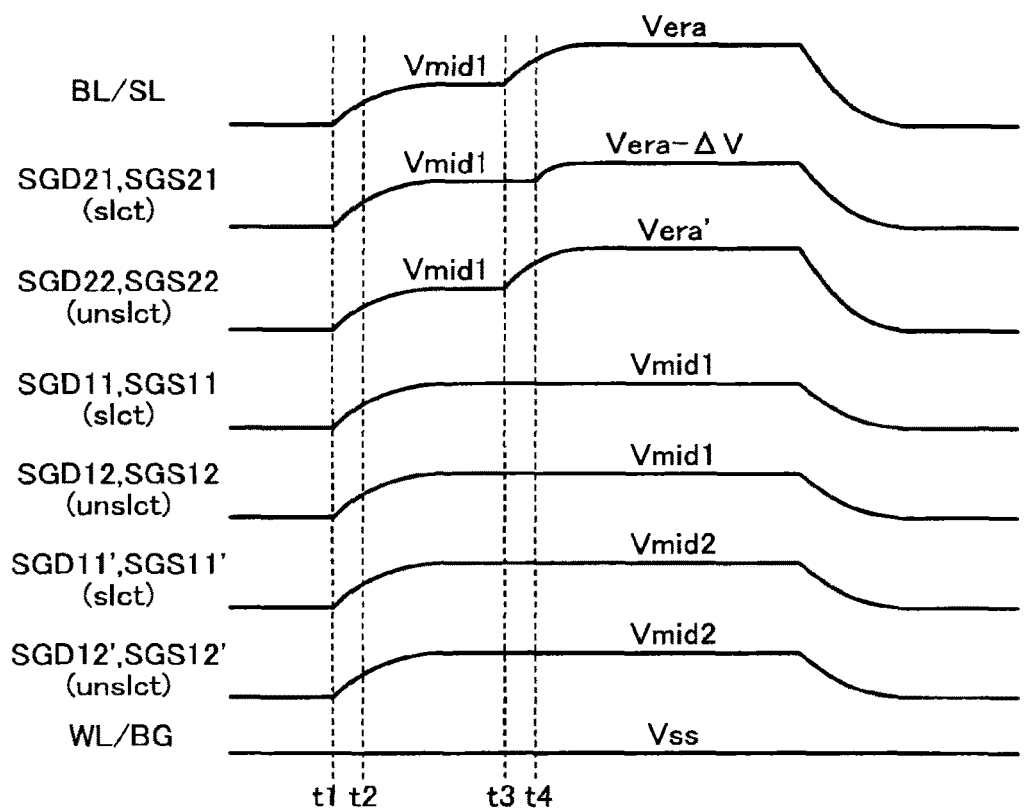
FIG. 28 shows the erase operation in the sixth embodiment.

In both the selected sub-block SB1 and the unselected sub-block SB2, the first drain side select transistors SGD1 (SGD11 and SGD12) and the first source side select transistors SGS1 (SGS11 and SGS12) are applied with the voltage Vmid1, and the first drain side select transistors SGD1' (SGD11' and SGD12') and the first source side select transistors SGS1' (SGS11' and SGS12') are applied with a voltage Vmid2 (<Vmid1) smaller than this voltage Vmid1 (refer to FIG. 28). As a result, the difference in voltage applied between the plurality of lines disposed adjacent to each other with a small wiring space is further reduced compared to the previous embodiments. Hence, the risk of a GIDL current being generated can be reduced.

Figure 29:
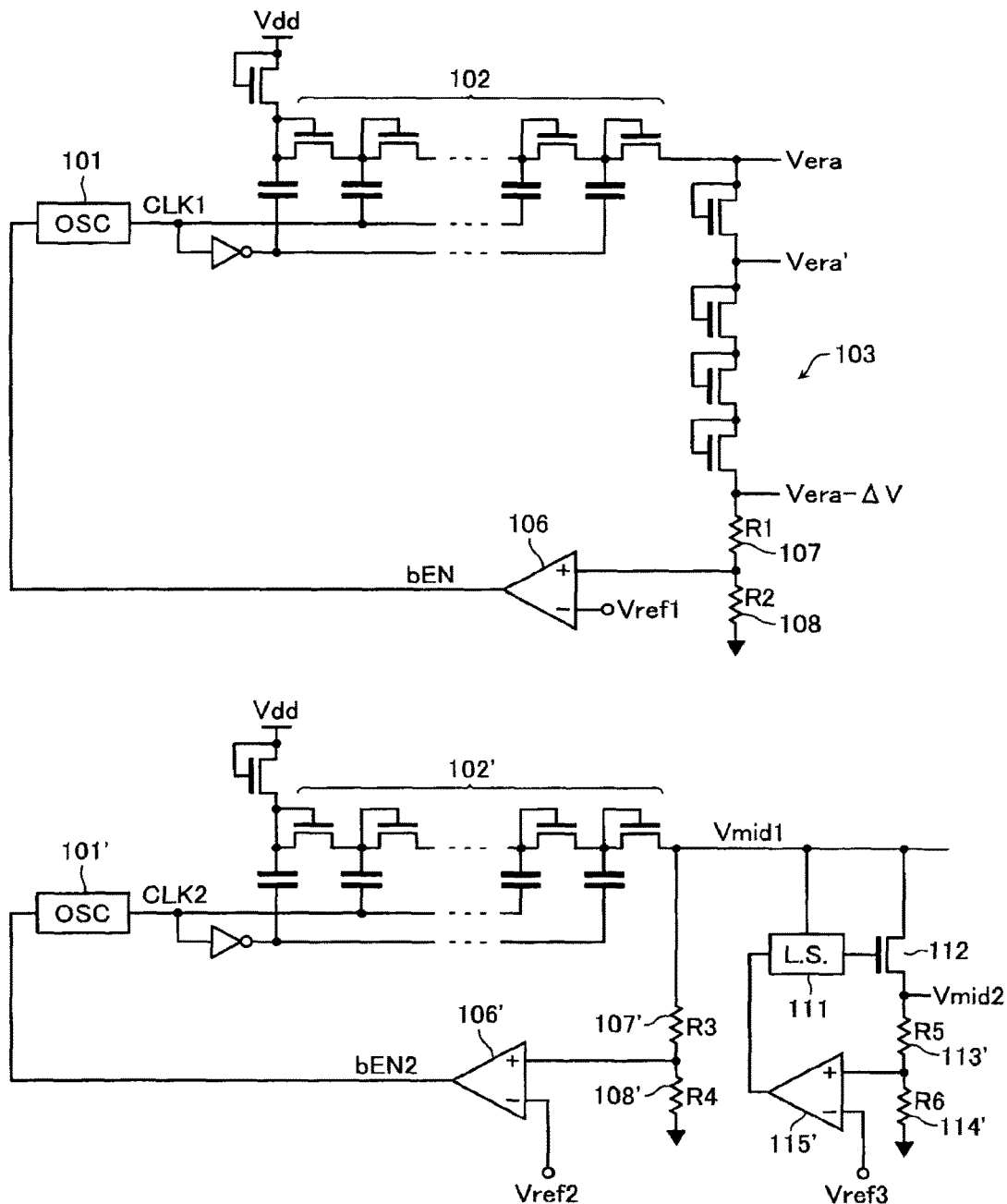
FIG. 29 is one example of a charge pump circuit and a voltage value adjusting circuit optimal for generating various voltages in the sixth embodiment.

FIG. 29 is one example of a charge pump circuit utilizable in this embodiment. A circuit configured to generate the voltages Vera, Vera', and Vera-ΔV shown in an upper portion of FIG. 29 has a configuration similar to that in FIG. 23. Moreover, a circuit shown in a lower portion of FIG. 29 is a circuit for generating the voltages Vmid1 and Vmid2. Configurative elements identical to those in the circuit in the lower portion of FIG. 23 are assigned with identical symbols to FIG. 23 and detailed descriptions thereof are omitted. Furthermore, in order to generate the voltage Vmid2, the circuit in the lower portion of FIG. 29 comprises a level shifter circuit 111', an NMOS transistor 112', splitting resistances 113' and 114', and a differential amplifier circuit 115'. These are similar to the level shifter circuit 111, NMOS transistor 112, splitting resistances 113 and 114, and differential amplifier circuit 115 shown in FIG. 17A, and detailed descriptions thereof are thus omitted.

Note that the above description is a specific description of configuration and operation in the case where there are two each of the first drain side select transistors SDTr1 and the first source side select transistors SSTr1 (SDTr1 and SDTr1', and SSTr1 and SSTr1'). However, there is no need for the number of first drain side select transistors SDTr1 and first source side select transistors SSTr1 to be two, and there may be three or more. In the case that there are n first drain side select transistors SDTr1(1), SDTr1(2), . . . , SDTr1(n) disposed in order from a side close to the bit line BL, the voltage Vmid1 applied to a gate SGD1(1) of the select transistor SDTr1(1) is set to a largest value, and, thereafter, the further a select transistor SDTr is from the bit line BL, the smaller the value of the voltage Vmid applied to its gate is set (Vmid1>Vmid2> . . . >Vmidn). Note that the voltage applied to gates of the first drain side select transistors and first source side select transistors in the selected sub-block may be set to the voltage Vera-ΔV in place of Vmid1, Vmid2, . . . , Vmidn, similarly to in the modified example in the second embodiment (FIG. 16A).

Seventh Embodiment

Figure 30:
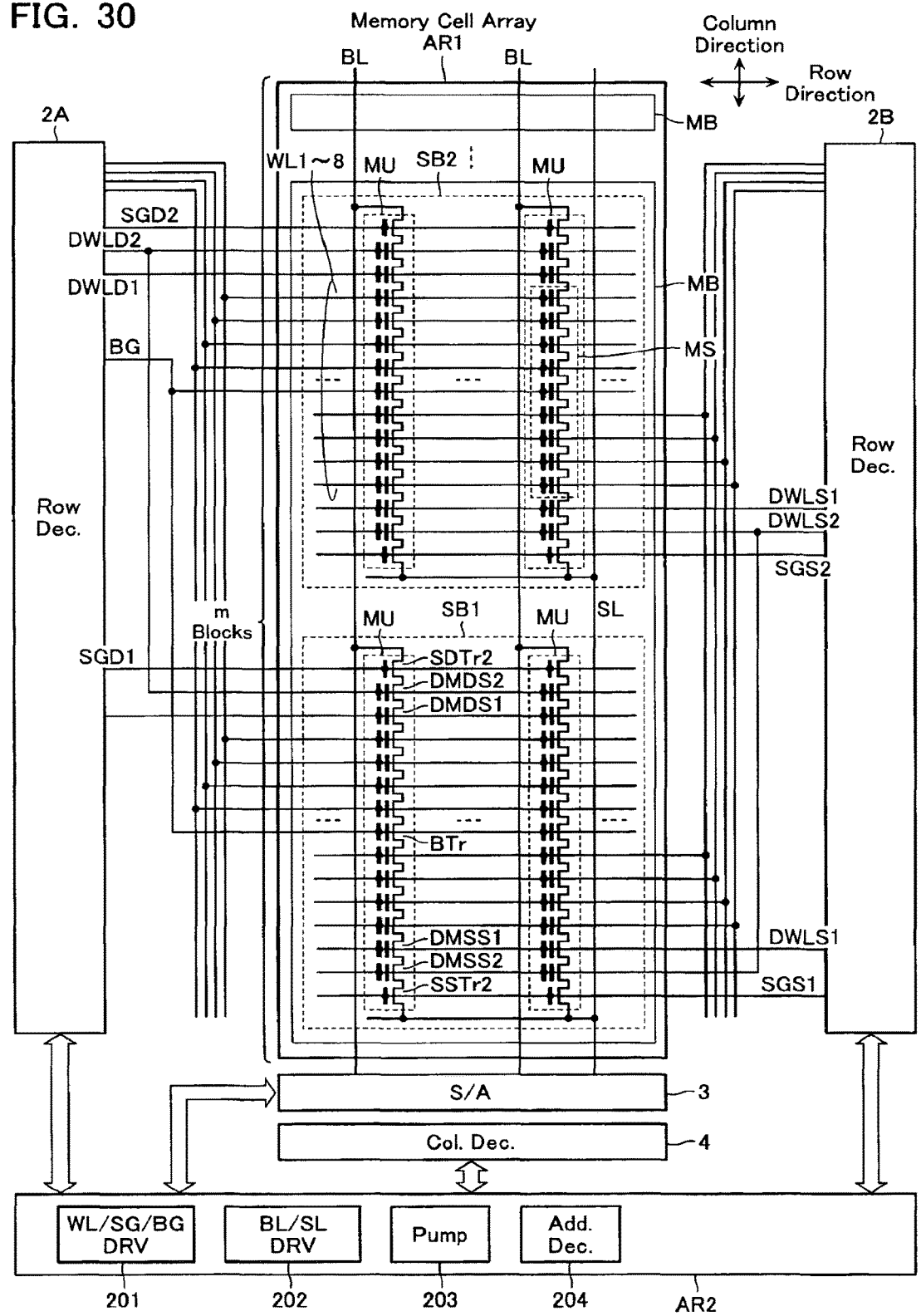
FIG. 30 is a circuit diagram of an overall configuration of a nonvolatile semiconductor memory device in accordance with a seventh embodiment.
Figure 31:
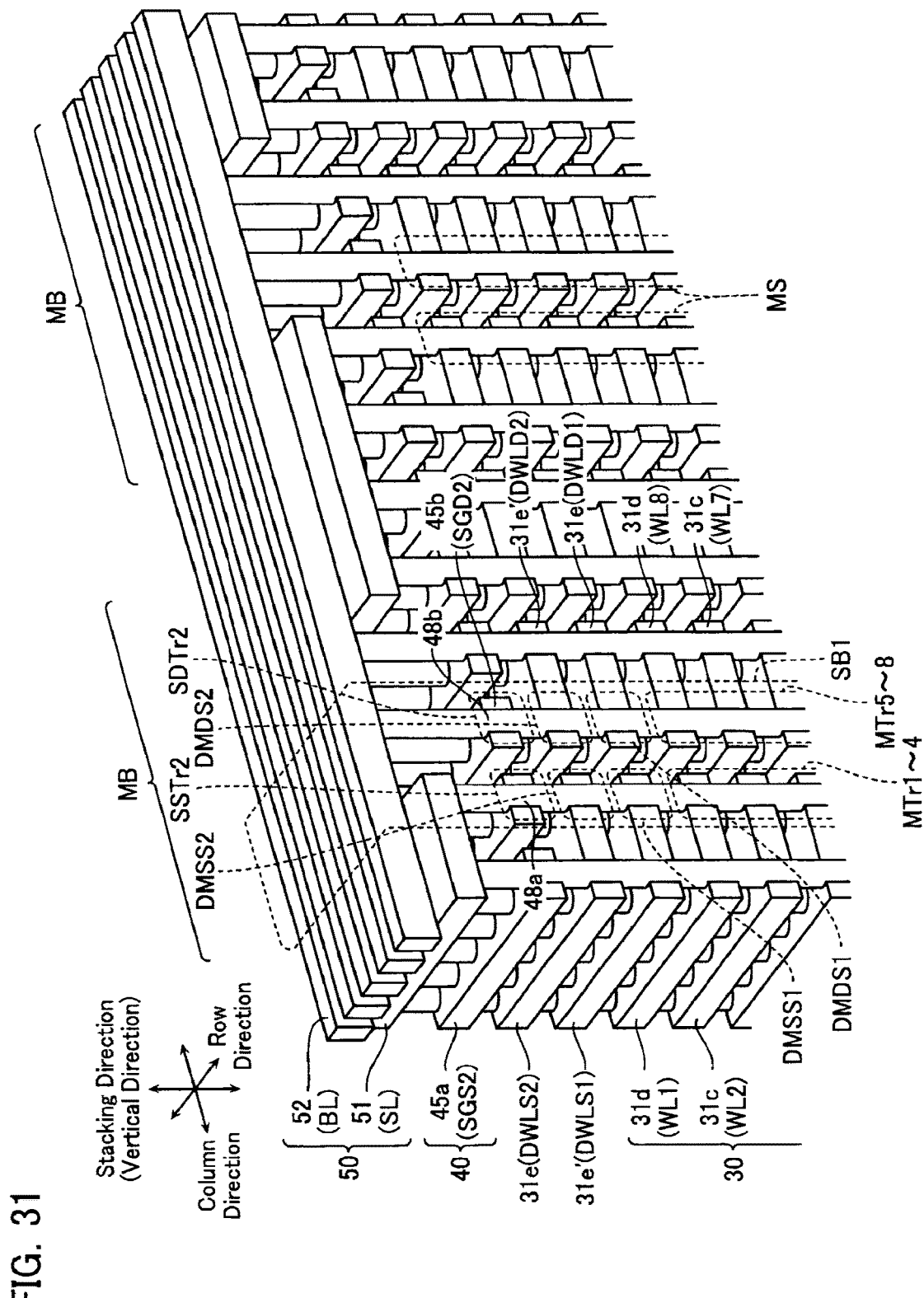
FIG. 31 is a schematic perspective view of a memory cell array AR1 in FIG. 30.

Next, a nonvolatile semiconductor memory device in accordance with a seventh embodiment is described with reference to FIGS. 30-33. FIG. 30 is a circuit diagram of an overall configuration of the nonvolatile semiconductor memory device in accordance with the seventh embodiment. FIG. 31 is a schematic perspective view of a memory cell array AR1 in the nonvolatile semiconductor memory device in accordance with the seventh embodiment. Note that configurations similar to those in the first and second embodiments are assigned with identical symbols to the first and second embodiments and detailed descriptions thereof are omitted below.

This embodiment has the feature of including dummy transistors between the select transistors SDTr2 and SSTr2 and the memory transistors MTr1 and MTr8, similarly to the fourth embodiment. However, this embodiment differs from the fourth embodiment in having a plurality (for example, two) of the dummy transistors connected in series to one select transistor SDTr2 (or SSTr2). Specifically, two dummy transistors DMDS2 and DMDS1 are connected in series to the drain side select transistor SDTr2. In addition, two dummy transistors DMSS2 and DMSS1 are connected in series to the source side select transistor SSTr2. The dummy transistor DMDS1 is connected in series to the memory transistor MTr8. The dummy transistor DMDS2 is connected in series to the dummy transistor DMDS1 and has one end connected to the drain side select transistor SDTr2. The dummy transistor DMSS1 is connected in series to the memory transistor MTr1. The dummy transistor DMSS2 is connected in series to the dummy transistor DMSS1 and has one end connected to the source side select transistor SSTr2. Configurations of other portions are substantially identical to configurations in the fourth embodiment, and repetitive descriptions are thus omitted.

Figure 32:
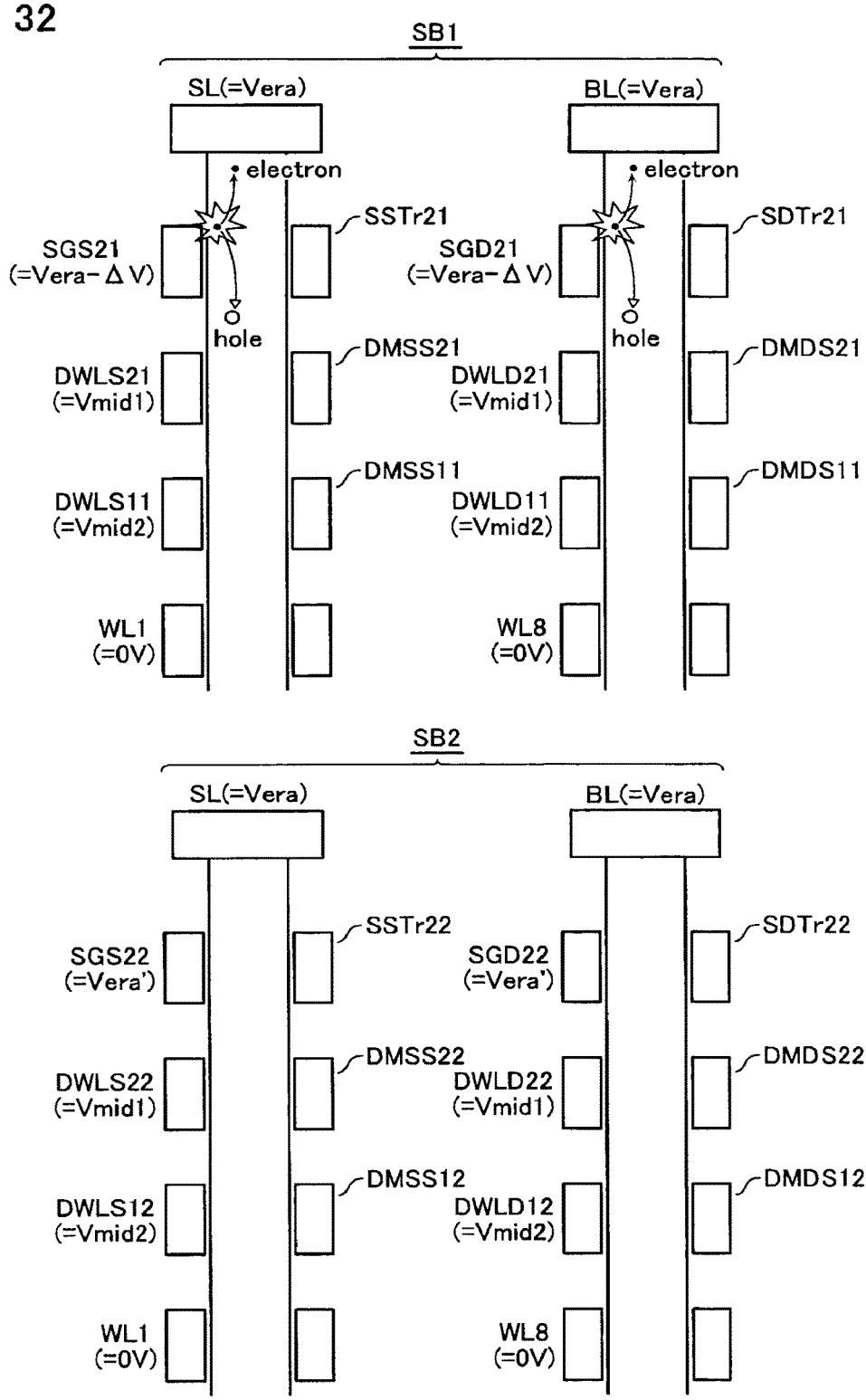
FIG. 32 shows an erase operation in the seventh embodiment.
Figure 33:
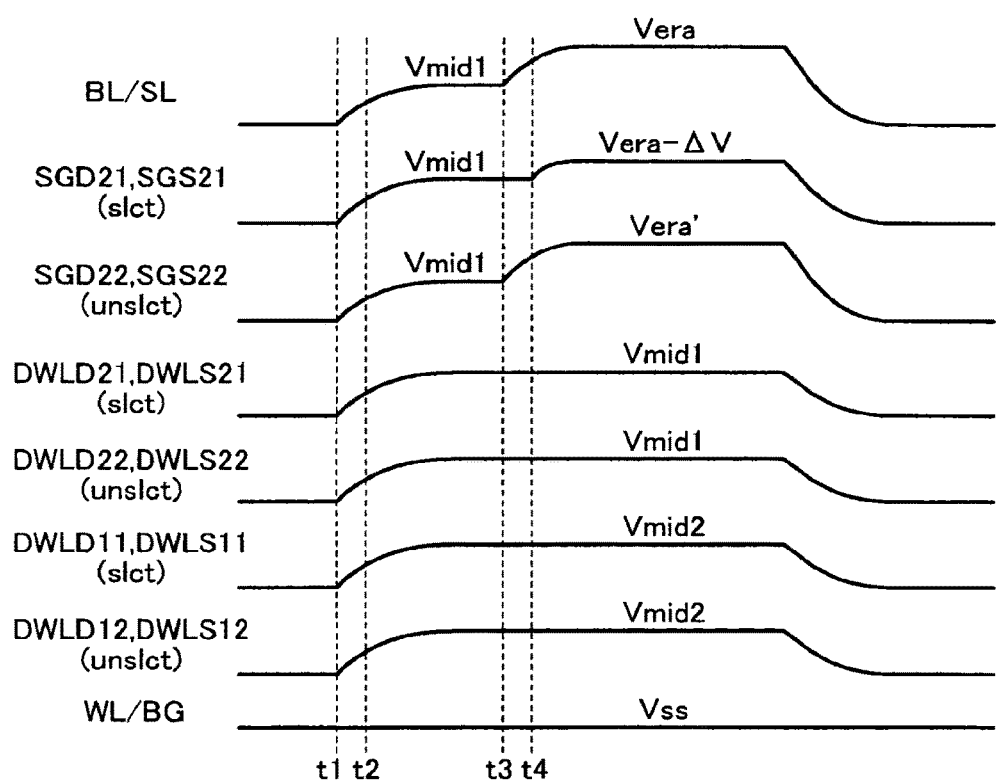
FIG. 33 shows the erase operation in the seventh embodiment.

Next, an erase operation in the nonvolatile semiconductor memory device in accordance with the seventh embodiment is described with reference to FIGS. 32 and 33. Similarly to the description in the sixth embodiment, the case is described here where, of the two sub-blocks in one memory block MB, the sub-block SB1 is set as erase target, and the sub-block SB2 is set to erase prohibit. Note that, in FIG. 32, the dummy transistors DMDS2, DMDS1, DMSS2, and DMSS1 in the sub-block SB1 are referred to as DMDS21, DMDS11, DMSS21, and DMSS11, respectively. Moreover, the dummy transistors DMDS2, DMDS1, DMSS2, and DMSS1 in the sub-block SB2 are referred to as DMDS22, DMDS12, DMSS22, and DMSS12, respectively.

Voltages applied finally to the bit lines BL, source line SL, and select gate lines SGD2 and SGS2 for the erase operation are substantially similar to those in the sixth embodiment. Moreover, voltages applied to dummy word lines DWLD21, DWLS21, DWLD11, DWLS11, DWLD22, DWLS22, DWLD12, and DWLS12 of the dummy transistors are identical to voltages applied to the select gate lines SGD11, SGS11, SGD11', SGS11', SGD12, SGS12, SGD12', and SGS12' in the sixth embodiment. This allows similar advantages to be displayed to those in the sixth embodiment. Note that the voltage applied to the dummy word lines DWLD21 and DWLS21 in the selected sub-block SB1 may be set to the voltage Vera-ΔV in place of the voltage Vmid1, similarly to in the modified example in the second embodiment (FIG. 16A).

Furthermore, the fact that the number of dummy transistors DMDS and DMSS need not be two, and may be three or more is similar to the select transistors SDTr1 and SSTr1 in the sixth embodiment. The fact that, at this time, the closer a dummy transistor DMDS or DMSS is to the bit line BL, the larger the value of the voltage Vmid applied to its gate is set, and the further a dummy transistor DMDS or DMSS is to the bit line BL, the smaller the value of the voltage Vmid applied to its gate is set is similar to the sixth embodiment. In addition, the charge pump circuit shown in FIG. 29 may be utilized for these erase operations.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, each of the above-described embodiments describes an example including a memory cell array AR1 which has U shaped memory strings MS arranged therein. However, the above-described embodiments are not limited to this and may employ, for example, I shaped memory strings having all the memory transistors arranged in one straight line.

Moreover, in the above-described embodiments, the select transistors SDTr and SSTr differ from the memory transistors MTr in being configured as transistors which have a gate insulating film formed from a one-layer film of silicon oxide, that is, which lack the charge storage layer 33b. However, the present invention is not limited to this configuration, and the select transistors SDTr and SSTr may be configured to include the memory gate insulating layer 33 comprising the three-layer structure of the block insulating layer 33a, charge storage layer 33b, and tunnel insulating layer 33c, similarly to the memory transistors.

What is claimed is:

1. A memory device, comprising:
a memory cell array including a first memory block,
the first memory block including a first sub block and a second sub block,
the first sub block including a first memory unit and a second memory unit,
the first memory unit including a first drain side selective transistor, a plurality of first memory cells, a first source side selective transistor, a plurality of second memory cells, and a first connecting portion that connects the first memory cells and the second memory cells in series,
the second memory unit including a second drain side selective transistor, a plurality of third memory cells, a second source side selective transistor, a plurality of forth memory cells and a second connecting portion that connects the third memory cells and the fourth memory cells in series;
the second sub block including a third memory unit and a fourth memory unit,
the third memory unit including a third drain side selective transistor, a plurality of fifth memory cells, a third source side selective transistor, a plurality of sixth memory cells and a third connecting portion that connects the fifth memory cells and the sixth memory cells in series;

the fourth memory unit including a fourth drain side selective transistor, a plurality of seventh memory cells, a fourth source side selective transistor, a plurality of eighth memory cells and a fourth connecting portion that connects the seventh memory cells and the eighth memory cells in series;

a first bit line connected to the first drain side selective transistor and the third drain side selective transistor;

a second bit line connected to the second drain side selective transistor and the fourth drain side selective transistor;

a plurality first word lines connected to gates of the first memory cells, gates of the third memory cells, gates of the fifth memory cells, and gates of the seventh memory cells, respectively, a plurality second word lines connected to gates of the second memory cells, gates of the fourth memory cells, gates of the sixth memory cells, and gates of the eighth memory cells respectively;

a first source side select gate line connected to a gate of the first source side selective transistor and a gate of the second source side selective transistor;

a second source side select gate line connected to a gate of the third source side selective transistor and a gate of the fourth source side selective transistor; and a control circuit which applies a first voltage to the first bit line and the second bit line, a second voltage which is lower than the first voltage to the first source side select gate line, a third voltage which is higher than the second voltage to the second source side select gate line, a fourth voltage which is lower than the second voltage to the plurality of first word lines and the plurality of second word lines, while erase operation to the first sub block is operated.

2. The memory device according to claim 1, wherein the first source side select gate line and the second source side select gate line are electrically disconnected from each other and capable to apply a voltage independently.

3. The memory device according to claim 1, wherein one of the first word lines and a corresponding one of the second word lines are disposed in the same layer, respectively, and the one of the first word lines and the corresponding one of the second word lines are electrically disconnected from each other.

4. The memory device according to claim 1, wherein the first connecting portion, the second connecting portion, the third connecting portion, and the fourth connecting portion include poly silicon.

* * * * *